(12) United States Patent
Cela Greven et al.

(10) Patent No.: US 11,171,251 B2
(45) Date of Patent: Nov. 9, 2021

(54) PROCESS FOR FORMING CONDUCTIVE TRACK OR COATING

(71) Applicant: JOHNSON MATTHEY PUBLIC LIMITED COMPANY, London (GB)

(72) Inventors: Beatriz Cela Greven, Maastricht (NL); Jonathan Charles Shepley Booth, Berkshire (GB); Nicholas Nowak, Berkshire (GB); Simon Johnson, Berkshire (GB); Tobias Droste, Muehltal (DE)

(73) Assignee: Johnson Matthey Public Limited Company, London (GB)

( * ) Notice: Subject to any disclaimer, the term of this patent is extended or adjusted under 35 U.S.C. 154(b) by 0 days.

(21) Appl. No.: 15/775,477

(22) PCT Filed: Nov. 8, 2016

(86) PCT No.: PCT/GB2016/053485
§ 371 (c)(1),
(2) Date: May 11, 2018

(87) PCT Pub. No.: WO2017/081449
PCT Pub. Date: May 18, 2017

(65) Prior Publication Data
US 2018/0358485 A1    Dec. 13, 2018

(30) Foreign Application Priority Data

Nov. 13, 2015    (GB) ...................................... 1520077

(51) Int. Cl.
*H01L 31/0224*    (2006.01)
*H01B 1/22*    (2006.01)
*H01L 31/0216*    (2014.01)

(52) U.S. Cl.
CPC ....... *H01L 31/022425* (2013.01); *H01B 1/22* (2013.01); *H01L 31/02168* (2013.01)

(58) Field of Classification Search
CPC ...... H05K 2201/10143; H01L 31/0224; H01L 31/022425; H01L 31/02168;
(Continued)

(56) References Cited

U.S. PATENT DOCUMENTS 3,918,980 A    11/1975 Smith et al.
2011/0186121 A1   8/2011 Horteis et al.
(Continued)

FOREIGN PATENT DOCUMENTS

EP    0425073 A1    5/1991
JP    S64788 A1    1/1989
(Continued)

OTHER PUBLICATIONS

PCT/GB2016/053485 International Search Report and Written Opinion dated Jan. 13, 2017.

*Primary Examiner* — Tabassom Tadayyon Eslami
(74) *Attorney, Agent, or Firm* — BakerHostetler

(57) ABSTRACT

The invention relates to a process for forming a conductive track or coating on a substrate, comprising: applying a conductive paste to the substrate, the conductive paste comprising a solids portion dispersed in an organic medium, the solids portion comprising particles of electrically conductive material and an inorganic particle mixture comprising substantially crystalline particles of two or more different metal compounds, wherein the inorganic particle mixture includes substantially crystalline particles of a tellurium compound and is substantially lead free; and firing the applied conductive paste on the surface of the substrate with a firing profile in which the temperature of the surface of the applied conductive paste exceeds 500° C. for a period (Continued)

of two minutes or less. The invention further relates to a substrate having a conductive track or coating formed thereon.

16 Claims, 8 Drawing Sheets

(58) Field of Classification Search
CPC ......... H01L 31/02008; C23C 14/0623; H01M 4/5815; H01M 4/134; H01M 4/1397
See application file for complete search history.

(56) References Cited

U.S. PATENT DOCUMENTS

| | | |
|---|---|---|
| 2012/0152345 A1 | 6/2012 | Rajendran |
| 2012/0318343 A1 | 12/2012 | Rajendran et al. |
| 2013/0098431 A1* | 4/2013 | Chen ............... H01L 31/022425 136/252 |
| 2013/0269773 A1 | 10/2013 | Wang et al. |
| 2013/0284250 A1* | 10/2013 | Hang ....................... H01B 1/22 136/256 |
| 2014/0021417 A1* | 1/2014 | Koike ....................... H01B 1/22 252/514 |
| 2014/0042375 A1* | 2/2014 | Kim .......................... C03C 8/10 252/514 |
| 2014/0061830 A1 | 3/2014 | Li et al. |
| 2014/0287583 A1 | 9/2014 | Liu et al. |
| 2015/0155069 A1 | 6/2015 | Torardi et al. |

FOREIGN PATENT DOCUMENTS

| | | |
|---|---|---|
| KR | 201220028789 A1 | 3/2012 |
| WO | WO 2012/158905 A1 | 11/2012 |
| WO | WO 2014/123840 A2 | 8/2014 |
| WO | WO 2016/064707 A1 | 4/2016 |

* cited by examiner

PROCESS FOR FORMING CONDUCTIVE TRACK OR COATING

CROSS-REFERENCE TO RELATED APPLICATIONS

This application is the National Stage of International Patent Application No. PCT/GB2016/053485, filed Nov. 8, 2016, which claims priority from Great Britain Patent Application No. 1520077.7, filed Nov. 13, 2015, each of which application is incorporated herein by reference in its entirety for any and all purposes.

FIELD OF THE INVENTION

The present invention relates to a process for forming a conductive track or coating on a substrate, and to a substrate having a conductive track or coating formed thereon by that process. Typically, the substrate is a semiconductor substrate of a solar cell.

BACKGROUND OF THE INVENTION

Screen printed conductive (e.g. silver) pastes are routinely used as conductive tracks for solar cells, such as silicon solar cells. The pastes typically comprise conductive (e.g. silver) powder, glass frit, and sometimes one or more additional additives, all dispersed in an organic medium. The glass frit has several roles. During firing, it becomes a molten phase and so acts to bond the conductive track to the semiconductor wafer. However, the glass frit is also important in etching away the anti-reflective or passivation layer (usually silicon nitride) provided on the surface of the semiconductor wafer, to permit direct contact between the conductive track and the semiconductor. The glass frit is typically also important in forming an ohmic contact with the semiconductor emitter.

The quality of the contact between the conductive track and the semiconductor wafer is instrumental in determining the efficiency of the final solar cell. The best glass frits need to be optimised to flow at the correct temperature, and to provide the correct degree of etching of the antireflective layer. If too little etching is provided, then there will be insufficient contact between the semiconductor wafer and the conductive track, resulting in a high contact resistance. Conversely, excessive etching may lead to deposition of large islands of silver in the semiconductor, disrupting its p-n junction and thereby reducing its ability to convert solar energy into electrical energy.

Much recent attention has focused on improving the glass frit materials included in conductive pastes for photovoltaic cells, to provide a good balance of properties.

Conductive pastes comprising conductive powder, glass frit, and sometimes one or more additional additives, all dispersed in an organic medium, are also used to form conductive tracks or conductive coatings in thin film solar cells, which are made by depositing one or more thin layers of photovoltaic material onto a substrate, such as glass or metal, and in a range of other electronics applications, including passive electronic components, e.g. in terminal electrodes for zinc oxide varistor components, terminations for MLCC (multi-layer ceramic capacitors), electrodes on TCO (transparent conductive oxide) coated glass substrate, conductive layers on NTC (negative temperature coefficient) thermistors, metallization of functional piezoceramics; and automotive applications including backlights, sidelights, heatable mirrors and windscreens, and antennae.

SUMMARY OF THE INVENTION

There remains a need for conductive pastes e.g. for solar cells, which offer a good balance of properties. In particular, there remains a need for conductive pastes for solar cells which provide an excellent (lowered) contact resistance without negatively influencing the p-n junction of a solar cell, and which include glass frit or other material which flows at a suitable temperature for firing the conductive paste during manufacture of a solar cell.

The present inventors have found, surprisingly, that substantially crystalline particles included in a conductive paste may give results which are as good as or better than the results obtained for pastes including a glass. In particular, the present inventors have found that an inorganic particle mixture comprising substantially crystalline particles of two or more different metal compounds is a suitable replacement for glass frit.

A particular advantage of using substantially crystalline particles of different metal compounds is that it removes the glass forming step from the process of manufacturing a conductive paste. The glass forming step typically has high energy demands, since it requires the glass precursors to be heated to temperatures above the melting point of the crystalline materials used to manufacture the glass. To ensure complete melting and dissolution of the raw materials used to form the glass, they are typically heated to a temperature in excess of 1000° C., and held there for a period of about 30 minutes at a minimum, (this can vary depending on composition and batch size). Glasses are typically used in conductive pastes due to their relatively low softening and melting points. Typically, glasses used in conductive pastes flow at temperatures in the range of about 400-700° C. The present inventors have surprisingly found that despite the considerably higher melting point of at least some of the substantially crystalline metal compounds used in the pastes of the present invention, these mixtures still exhibit similar flow and melt behaviour to glass frits, which enables them to be used with a similar firing profile and manufacturing method as pastes comprising glass frit.

As the skilled person will understand, avoiding the energy intensive glass forming step has advantages outside the field of conductive pastes for solar cells. The present inventors consider that their invention is applicable also to conductive pastes used to form conductive tracks and conductive coatings in other electronics applications, such as those mentioned herein.

Accordingly, in a first preferred aspect the present invention provides a process for forming a conductive track or coating on a substrate, comprising:
  (i) applying a conductive paste to the substrate, the conductive paste comprising a solids portion dispersed in an organic medium, the solids portion comprising particles of electrically conductive material and an inorganic particle mixture comprising substantially crystalline particles of two or more different metal compounds, wherein the inorganic particle mixture includes substantially crystalline particles of a tellurium compound and is substantially lead free; and
  (ii) firing the applied conductive paste on the surface of the substrate with a firing profile in which the temperature of the surface of the applied conductive paste exceeds 500° C. for a period of two minutes or less, to produce a conductive track or coating comprising a conductive layer formed from the particles of electrically conductive material and an amorphous oxide layer formed from the inorganic particle mixture.

In a second preferred aspect, the present invention provides a substrate having a conductive track or coating formed thereon, obtainable by
(i) applying a conductive paste to the substrate, the conductive paste comprising a solids portion dispersed in an organic medium, the solids portion comprising particles of electrically conductive material and an inorganic particle mixture comprising substantially crystalline particles of two or more different metal compounds, wherein the inorganic particle mixture includes substantially crystalline particles of a tellurium compound and is substantially lead free; and
(ii) firing the applied conductive paste on the surface of the substrate with a firing profile in which the temperature of the surface of the applied conductive paste exceeds 500° C. for a period of two minutes or less
wherein the conductive track or coating comprises a conductive layer formed from the particles of electrically conductive material and an amorphous oxide layer formed from the inorganic particle mixture.

The substrate may be a semiconductor substrate, e.g. a semiconductor substrate of a solar cell.

DETAILED DESCRIPTION

Figure 1:
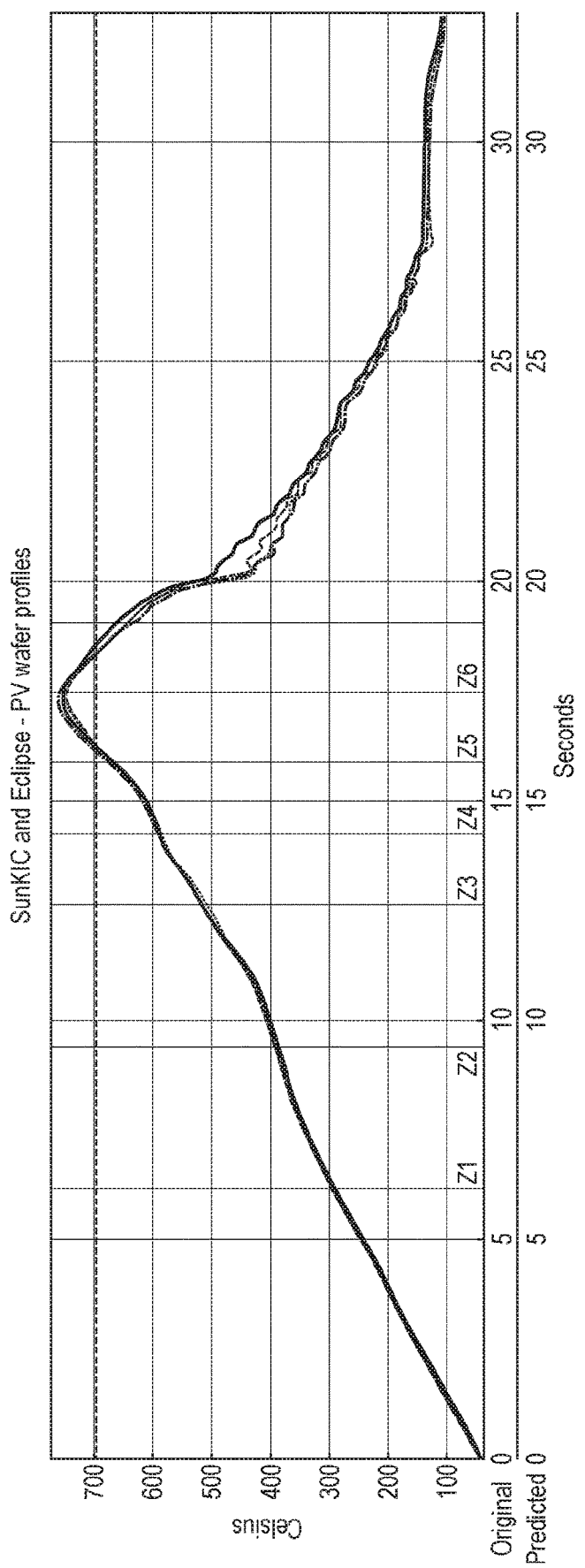
FIG. 1 shows an example firing curve for a solar cell prepared in the Examples.

Preferred and/or optional features of the invention will now be set out. Any aspect of the invention may be combined with any other aspect of the invention unless the context demands otherwise. Any of the preferred and/or optional features of any aspect may be combined, either singly or in combination, with any aspect of the invention unless the context demands otherwise.

For example, the discussion of the inorganic particle mixture content, raw materials and particle size distribution is applicable to the aspects of the invention relating to pastes, methods and blends equally.

Conductive pastes of the present invention include an organic medium and a solids portion. The solids portion includes electrically conductive material and an inorganic particle mixture. Each of these will be discussed, as will various methods of using them to make a conductive paste.
Inorganic (e.g. Oxide) Particle Mixture—Content The solids portion of the conductive pastes described herein contains a blend of substantially crystalline inorganic materials in particulate form. This inorganic blend is sometimes referred to as an oxide particle mixture herein. The oxides, carbonates, nitrates or other materials as described below can be mixed (for example, by co-milling) and then incorporated into a conductive paste.

Generally, in some aspects of the invention the inorganic particle mixture is made up of two or more different particulate inorganic materials such as metal compounds, e.g. metal oxides, metal carbonates or metal nitrates. The particles are substantially crystalline. The mixture may contain non-oxide materials and may be formed from materials which are not oxides.

The particulate nature means that discrete, separate or individual particles of each inorganic component are present. These are different from the fused, amorphous structures of the glass frits previously known. Since the inorganic particles are substantially crystalline, they do not exhibit a glass transition.

In the solids portion, electrically conductive material and an inorganic particle mixture are present. It may be that these are the only components of the solids portion. The solids portion may therefore consist of only an electrically conductive material and an inorganic particle mixture.

Therefore, in the solids portion the content of amorphous oxide material, or glass, is relatively lower. For example the glass content of the solids portion may be less than 20 wt %, less than 15 wt %, less than 10 wt %, less than 5 wt %, less than 2.5 wt %, less than 1 wt %, less than 0.5 wt %, less than 0.25 wt %, less than 0.1 wt %, less than 0.05 wt % or less than 0.01 wt %. It may be that the solids portion is substantially glass-free.

In some embodiments, the solids portion does not include any intentionally added glass and/or any intentionally formed glass phase.

It will be understood by the skilled reader that a glass material is not synonymous with an amorphous material, or even an amorphous region within a crystalline material. A glass material exhibits a glass transition. While glasses may include some crystalline domains (they may not be entirely amorphous) these are different from the discrete crystalline particles described herein.

Of course, it will be recognised by the skilled person that some amorphous or glassy phase may be formed even when substantially crystalline raw materials are used due to the nature of the processing conditions used. In aspects of the present invention this is minimised. For example, there may be some surface reaction of the oxide particles induced by milling, or deposition of carbon from the breakdown of a raw material such as lithium carbonate.

However, the lack of glass transition (that is, a non-exhibition of glass transition) may characterise the difference from known materials.

The inorganic (e.g. oxide) particle mixture may include a metal oxide. It is apparent to the reader that many such oxides are known. The inorganic particle mixture includes substantially crystalline particles, which are typically substantially crystalline particles of a metal compound. Each metal compound may, for example, be selected from a metal oxide, a metal carbonate or a metal nitrate. Particularly, compounds (e.g. oxides) of the sort generally used in the field of conductive paste manufacture for solar cells are contemplated.

Some specific metal compounds which may be included in the present invention include $TeO_2$, $Li_2O$, $Li_2CO_3$, $Bi_2O_3$, $Bi_5(OH)_9NO_3)_4$, $ZnO$, $Ce_2O_3$, $CeO_2$, $Na_2O$, $Na_2CO_3$ and $MoO_3$.

In the present invention, the inorganic particle mixture includes substantially crystalline particles of a compound of tellurium, such as tellurium oxide, paratellurite or $TeO_2$. In some embodiments the present inorganic particle mixture includes substantially crystalline particles of a compound of cerium, such as cerium oxide or $CeO_2$. In some embodiments the present inorganic (e.g. oxide) particle mixture includes substantially crystalline particles of a compound of bismuth, e.g. bismuth nitrate, or bismuth oxide, dibismuth trioxide, or $Bi_2O_3$.

The inorganic particle mixture may include two or more different metal compounds, in some embodiments three or more, four or more, five or more or six or more different metal compounds.

The content of the different metal compounds contained may, or course, differ. There may be one, two, three or more metal compounds which have significantly higher content than the other metal compounds contained. For example, in some embodiments the content of the compound of tellurium (e.g. $TeO_2$) is higher than the content of any other metal compound. In some embodiments, a compound of tellurium and a compound of bismuth are the two compounds with the highest contents—that is, one of a compound of tellurium and a compound of bismuth is the compound with the highest content, and the other is the compound with the second to highest content. The content as used herein may refer to the content by weight.

In certain embodiments, one or more (e.g. each) of the metal compounds includes substantially only one type of metal element. That is, in the compound there are metal and other non-metal (e.g. oxygen) atoms or ions present. That is, there may be substantially only a single cationic species present in a given metal compound included in the present invention. For example, the presence of substantially only a single type of metal atom or ion may be identified using XRD to confirm that the crystal structure of the substantially crystalline particles of metal compound corresponds to the crystal structure of a compound (e.g. oxide) of a single metal. As the skilled person will understand, a compound of a single metal may include incidental impurities which may be a different metal atom or ion. Such incidental impurities will be present in the metal compound at a very low level (e.g. <1 mol %, or <0.5 mol % with respect to the entire metal compound in question). Furthermore, processing of the metal compounds (e.g. co-milling) may induce some surface modification or reaction of the compounds. However, in this case the bulk of the material remains metal compound of a single metal, and can still be identified by XRD as described above.

Two or more of the metal compounds, in some embodiments three or more, four or more, five or more or six or more of the metal compounds includes substantially only one type of metal element.

Accordingly, in some embodiments each compound or other material included in the inorganic particle mixture includes only one type of metal element. It may therefore be that the inorganic particle mixture is substantially free of mixed metal compounds, e.g. mixed oxides. Mixed oxides include more than one type of metal element.

As used herein, the term "substantially free of mixed oxides" is intended to include inorganic (e.g. oxide) particle mixtures which contain no intentionally added mixed oxides. For example, the inorganic (e.g. oxide) particle mixture may include less than 0.1 wt % mixed oxide, for example less than 0.05 wt %, less than 0.01 wt % or less than 0.005 wt % mixed oxide. For example, the inorganic particle mixture may include no intentionally added mixed oxide. As used herein, the term "substantially free of mixed metal compounds" should be interpreted analogously.

Mixed oxides are known in this art. In prior art glass frit formation techniques a mixed oxide is generally formed. The present inventors have surprisingly found that the oxides and other starting materials used to make such a glass in the prior art can instead be prepared (for example by blending or co-milling) to give an inorganic (e.g. oxide) particle mixture in substantially crystalline, particulate form and yet the same or better results achieved.

Except where specified otherwise, the inorganic compound contents described herein are given as weight percentages. These weight percentages are with respect to the total weight of the inorganic particle mixture. The weight percentages are the percentages of the components used as starting materials in preparation of the inorganic particle mixture or conductive paste, on an oxide basis unless specified otherwise.

The inorganic particle mixture described herein is not generally limited. Many different oxides which are suitable for use in conductive pastes for solar cells are well known in the art.

In the present invention, the inorganic particle mixture is substantially lead-free. As used herein, the term "substantially lead-free" is intended to include inorganic particle mixtures which contain no intentionally added lead. For example, the inorganic particle mixture may include less than 0.1 wt % PbO, for example less than 0.05 wt %, less than 0.01 wt % or less than 0.005 wt % PbO.

It may be preferable that the inorganic particle mixture is substantially boron-free. As used herein, the term "substantially boron-free" is intended to include inorganic particle mixtures which contain no intentionally added boron. For example, the inorganic particle mixture may include less than 0.1 wt % boron (calculated as $B_2O_3$), for example less than 0.05 wt %, less than 0.01 wt % or less than 0.005 wt % (calculated as $B_2O_3$).

The inorganic particle mixture may include at least 20 wt %, at least 25 wt %, at least 30 wt %, at least 35 wt %, at least 40 wt %, or at least 45 wt % of the compound of tellurium (calculated as $TeO_2$). The inorganic particle mixture may include 80 wt % or less, 75 wt % or less, 70 wt % or less, 65 wt % or less or 60 wt % or less of the compound of tellurium (calculated as $TeO_2$). For example, the inorganic (e.g. oxide) particle mixture may include 35 to 65 wt % of the compound of tellurium (calculated as $TeO_2$).

In some embodiments, the inorganic particle mixture includes a compound of bismuth, e.g. $Bi_2O_3$. The inorganic particle mixture may include at least 10 wt %, at least 15 wt %, at least 18 wt %, at least 20 wt % or at least 25 wt % of the compound of bismuth (calculated as $Bi_2O_3$). The inorganic particle mixture may include 60 wt % or less, 55 wt % or less, 50 wt % or less or 45 wt % or less of the compound of bismuth (calculated as $Bi_2O_3$). For example the inorganic particle mixture may include 20 to 50 wt % of the compound of bismuth (calculated as $Bi_2O_3$).

Alternatively, the compound of bismuth may be a bismuth nitrate, e.g. $Bi_5O(OH)_9(NO_3)_4$. The nitrate of bismuth (e.g. $Bi_5O(OH)_9(NO_3)_4$) may be used in an amount of at least 10 wt %, at least 15 wt %, at least 18 wt %, at least 20 wt % or at least 25 wt %. It may be used in an amount of 60 wt % or less, 55 wt % or less, 50 wt % or less or 45 wt % or less. For example it may be used in an amount of 20 to 50 wt %. In some embodiments, it may be preferable that $Bi_2O_3$ is used.

In some embodiments, the inorganic particle mixture includes a compound of cerium (e.g. $CeO_2$). The inorganic particle mixture may comprise 0 wt % or more, e.g. at least 0 0.1 wt %, at least 0.2 wt %, at least 0.5 wt %, at least 1 wt %, at least 1.5 wt %, at least 2 wt %, at least 2.5 wt %, at least 3 wt %, at least 3.5 wt %, at least 4 wt %, at least 4.5 wt %, at least 5 wt %, at least 6 wt %, or at least 7 wt % of the compound of cerium (calculated as $CeO_2$). The inorganic particle mixture may comprise 22 wt % or less, 20 wt % or less, 17 wt % or less, 15 wt % or less, 14 wt % or less, 13 wt % or less, 12 wt % or less, 11 wt % or less, 10 wt % or less, or 5 wt % or less of the compound of cerium (calculated as $CeO_2$). A particularly suitable $CeO_2$ content is from 1 wt % to 15 wt %.

The inorganic (e.g. oxide) particle mixture may include a compound of silicon (e.g. $SiO_2$). For example, the inorganic particle mixture may include 0 wt % or more, 0.1 wt % or more, 0.5 wt % or more or 1 wt % or more, 2 wt % or more or 2.5 wt % or more of the compound of silicon (calculated as $SiO_2$). The inorganic (e.g. oxide) particle mixture may include 20 wt % or less, 15 wt % or less, 10 wt % or less, 7 wt % or less or 5 wt % or less of the compound of silicon (calculated as $SiO_2$). For example, the inorganic particle mixture may include 0.1 to 7 wt % of $SiO_2$.

In some embodiments, it may be preferred that the inorganic particle mixture is substantially silicon-free. As used herein, the term "substantially silicon-free" is intended to include inorganic particle mixtures which contain no intentionally added silicon. For example, the inorganic (e.g. oxide) particle mixture may include less than 0.1 wt % silicon (calculated as $SiO_2$), for example less than 0.05 wt %, less than 0.01 wt % or less than 0.005 wt % silicon (calculated as $SiO_2$).

The inorganic (e.g. oxide) particle mixture may include alkali metal compound, for example one or more selected from compounds of lithium, sodium, potassium and rubidium, preferably one or more selected from compounds of lithium, sodium and potassium, more preferably one or both of compounds of lithium and sodium. One or more (e.g. each) alkali metal compound may conveniently be an alkali metal carbonate. In some embodiments, it is preferred that the inorganic (e.g. oxide) particle mixture includes a compound of lithium, e.g. lithium carbonate.

The inorganic particle mixture may include 0 wt % or more, 0.1 wt % or more, 0.5 wt % or more or 1 wt % or more alkali metal compound, calculated on an oxide basis. The inorganic particle mixture may include 10 wt % or less, 8 wt % or less, 7 wt % or less, 5 wt % or less, 4 wt % or less alkali metal compound, calculated on an oxide basis.

The inorganic (e.g. oxide) particle mixture may include 0 wt % or more, 1 wt % or more, 2 wt % or more, 4 wt % or more, 5 wt % or more or 6 wt % or more of a compound of lithium, calculated as $Li_2O$. The inorganic (e.g. oxide) particle mixture may include 20 wt % or less, 15 wt % or less, 13 wt % or less, 6 wt % or less 10 wt % or less, or 8 wt % or less of a compound of lithium, calculated as $Li_2O$. For example, the inorganic (e.g. oxide) particle mixture may include 5 to 12.5 wt % of a compound of lithium, calculated as $Li_2O$.

It is noted that one particular raw material which can be used to prepare inorganic particle mixtures and conductive pastes which include a compound of lithium is $Li_2CO_3$. It may be used as a raw material in an amount of 0 wt % or more, 1 wt % or more, 2 wt % or more, 4 wt % or more, 5 wt % or more or 6 wt % or more. It may be used as a raw material in an amount of 20 wt % or less, 15 wt % or less, 13 wt % or less, 6 wt % or less 10 wt % or less, or 8 wt % or less. For example it may be used as a raw material in an amount of 5 to 12.5 wt %.

In some embodiments, the inorganic particle mixture includes both a compound of tellurium and a compound of lithium. For example, both tellurium oxide and lithium oxide may be contained. The ratio of these compounds of lithium and tellurium may also be controlled in aspects of the present invention. For example, the molar ratio of Te to Li (Te:Li ratio) may be in the range from 1:1 to 100:1. The Te:Li ratio may be at least 2:1, at least 3:1, at least 4:1, at least 5:1 or at least 6:1. The Te:Li ratio may be 100:1 or less, 50:1 or less, 25:1 or less, 20:1 or less, 15:1 or less, 10:1 or less, 8:1 or less, 7.5:1 or less, or 7:1 or less. For example, the molar ratio of Te to Li (Te:Li ratio) may be in the range from 3:1 to 10:1, e.g. in the range from 5:1 to 8:1.

The inorganic (e.g. oxide) particle mixture may include a compound of zinc (e.g. ZnO). For example, the inorganic particle mixture may include 0 wt % or more, 0.1 wt % or more, 0.5 wt % or more, 1 wt % or more or 1.5 wt % or more of the compound of zinc, (calculated as ZnO). The inorganic particle mixture may include 15 wt % or less, 10 wt % or less, 7 wt % or less or 5 wt % or less of the compound of zinc (calculated as ZnO). For example, the inorganic (e.g. oxide) particle mixture may include 0.5 to 7 wt % of a compound of zinc, calculated as ZnO.

In some embodiments, it may be preferred that the inorganic (e.g. oxide) particle mixture is substantially zinc-free. As used herein, the term "substantially zinc-free" is intended to include inorganic particle mixtures which contain no intentionally added zinc. For example, the inorganic particle mixture may include less than 0.1 wt % zinc (calculated as ZnO), for example less than 0.05 wt %, less than 0.01 wt % or less than 0.005 wt % zinc (calculated as ZnO).

The inorganic particle mixture may include a compound of molybdenum (e.g. $MoO_3$). For example, the inorganic particle mixture may include 0 wt % or more, 0.1 wt % or more, 0.5 wt % or more of the compound of molybdenum (calculated as $MoO_3$). The inorganic particle mixture may include 10 wt % or less, 5 wt % or less, or 3 wt % or less of the compound of molybdenum (calculated as $MoO_3$). For example, the inorganic (e.g. oxide) particle mixture may include 0.1 to 5 wt % of molybdenum (calculated as $MoO_3$).

In some embodiments, it may be preferred that the inorganic particle mixture is substantially molybdenum-free. As used herein, the term "substantially molybdenum-free" is intended to include inorganic particle mixtures which contain no intentionally added molybdenum. For example, the inorganic particle mixture may include less than 0.1 wt % molybdenum (calculated as $MoO_3$), for example less than 0.05 wt %, less than 0.01 wt % or less than 0.005 wt % molybdenum (calculated as $MoO_3$).

The inorganic particle mixture may include a compound of chromium (e.g. $Cr_2O_3$). For example, the inorganic particle mixture may include 0 wt % or more, 0.1 wt % or more, 0.5 wt % or more of the compound of chromium (calculated as $Cr_2O_3$). The inorganic (e.g. oxide) particle mixture may include 10 wt % or less, 5 wt % or less, or 3 wt % or less of chromium (calculated as $Cr_2O_3$). For example, the inorganic (e.g. oxide) particle mixture may include 0.1 to 5 wt % of chromium (calculated as $Cr_2O_3$).

In some embodiments, it may be preferred that the inorganic particle mixture is substantially chromium-free. As used herein, the term "substantially chromium-free" is intended to include inorganic particle mixtures which contain no intentionally added chromium. For example, the inorganic particle mixture may include less than 0.1 wt % chromium (calculated as $Cr_2O_3$), for example less than 0.05 wt %, less than 0.01 wt % or less than 0.005 wt % chromium (calculated as $Cr_2O_3$).

The inorganic particle mixture may include a compound of tungsten (e.g. $WO_3$). For example, the inorganic particle mixture may include 0 wt % or more, 0.1 wt % or more, 0.5 wt % or more of the compound of tungsten (calculated as $WO_3$). The inorganic particle mixture may include 10 wt % or less, 5 wt % or less, or 3 wt % or less of the compound of tungsten (calculated as $WO_3$). For example, the inorganic (e.g. oxide) particle mixture may include 0.1 to 5 wt % of the compound of tungsten (calculated as $WO_3$).

In some embodiments, it may be preferred that the inorganic particle mixture is substantially tungsten-free. As used herein, the term "substantially tungsten-free" is intended to include inorganic particle mixtures which contain no intentionally added tungsten. For example, the inorganic particle mixture may include less than 0.1 wt % tungsten (calculated as $WO_3$), for example less than 0.05 wt %, less than 0.01 wt % or less than 0.005 wt % tungsten (calculated as $WO_3$).

The inorganic particle mixture may include a compound of barium (e.g. BaO). For example, the inorganic particle mixture may include 0 wt % or more, 0.1 wt % or more, 0.5 wt % or more of the compound of barium (calculated as BaO). The inorganic particle mixture may include 10 wt % or less, 5 wt % or less, or 3 wt % or less of the compound of barium (calculated as BaO). For example, the inorganic particle mixture may include 0.1 to 5 wt % of the compound of barium (calculated as BaO).

The inorganic particle mixture may include a compound of phosphorus (e.g. $P_2O_5$). For example, the inorganic particle mixture may include 0 wt % or more, 0.1 wt % or more, 0.5 wt % or more or 1 wt % or more of the compound of phosphorus (calculated as $P_2O_5$). The inorganic particle mixture may include 10 wt % or less, 7 wt % or less, 5 wt % or less or 3 wt % or less of the compound of phosphorus (calculated as $P_2O_5$).

The inorganic particle mixture may include further components, such as further oxide components. Typically, the inorganic particle mixture will include 20 wt % or less, 10 wt % or less, 7 wt % or less, 5 wt % or less, 3 wt % or less, 2 wt % or less or 1 wt % or less in total of further components. The inorganic particle mixture may include at least 0.1 wt % of further components. The further components may be one or more selected from the group consisting of compounds of germanium, calcium, zirconium, copper, silver and aluminium, e.g. $GeO_2$, CaO, $ZrO_2$, CuO, AgO and $Al_2O_3$.

Selection of the ingredients of the inorganic particle mixture or blend may be guided by the desired flow behaviour on firing. The inventors have found certain mixtures particularly suitable. For example, the inorganic particle mixture may preferably contain a mixture of ingredients providing a source of tellurium (for example, $TeO_2$) and a source of alkali metal, preferably lithium (for example, $LiCO_3$ or $Li_2O$). A source of bismuth (for example, $Bi_2O_3$ or $Bi_5O(OH)_3(NO_3)_4$) may also be included. A source of zinc (for example, ZnO) may also be included. The contents may be as described as above.

The inorganic particle mixture may consist essentially of a composition as described herein, and incidental impurities. In that case, as the skilled person will readily understand that the total weight % of the recited constituents will be 100 wt %, any balance being incidental impurities. Typically, any incidental impurity will be present at 0.1 wt % or less, 0.05 wt % or less, 0.01 wt % or less, 0.05 wt % or less, 0.001 wt % or less or 0.0001 wt % or less.

The solids portion of the conductive paste of the present invention may include 0.1 to 15 wt % of the inorganic particle mixture. The solids portion of the conductive paste may include at least 0.5 wt % or at least 1 wt % of the inorganic particle mixture. The solids portion of the conductive paste may include 10 wt % or less, 7 wt % or less or 5 wt % or less of the inorganic particle mixture.

It may be preferred that the inorganic particle mixture comprises at least compounds of lithium and tellurium. It may be preferred that the inorganic particle mixture comprises at least compounds of lithium, tellurium and bismuth. It may be preferred that the inorganic particle mixture comprises at least compounds of lithium, tellurium and zinc. It may be preferred that the inorganic particle mixture comprises at least compounds of lithium, tellurium, zinc and bismuth. It may be preferred that the inorganic particle mixture comprises at least compounds of lithium, tellurium, sodium, bismuth and zinc. It may be preferred that the inorganic particle mixture comprises at least compounds of lithium, tellurium and cerium. It may be preferred that the inorganic particle mixture comprises at least compounds of lithium, tellurium, cerium and bismuth. It may be preferred that the inorganic particle mixture comprises at least compounds of lithium, tellurium, cerium and zinc. It may be preferred that the inorganic particle mixture comprises at least compounds of lithium, tellurium, zinc, cerium and bismuth. It may be preferred that the inorganic particle mixture comprises at least compounds of lithium, tellurium, sodium, bismuth, cerium and zinc.

Typically, at least some of the substantially crystalline material of the inorganic particle mixture has a melting point of 700° C. or higher. For example, at least 50 wt %, at least 60 wt %, at least 70 wt %, at least 80 wt %, at least 90 wt %, or at least 95 wt % of the components of the inorganic particle mixture have a melting point of 700° C. or higher. In some embodiments, substantially all of the components of the inorganic particle mixture have a melting point of 700° C. or higher.

In some embodiments, some components of the inorganic particle mixture have a considerably higher melting point. For example, at least 5 wt %, at least 10 wt %, at least 20 wt % or at least 30 wt % of the components of the inorganic particle mixture may have a melting point in excess of 800° C. For example, at least 0.5 wt %, at least 1 wt %, at least 2 wt %, at least 5 wt % or at least 10 wt % of the components of the inorganic particle mixture may have a melting point in excess of 1000° C.

Melting points of some of the components which may be included in the inorganic particle mixture are set out below:

| Raw materials | Melting point/° C. |
|---|---|
| $Bi_2O_3$ | 817 |
| $TeO_2$ | 733 |
| $CeO_2$ | 2400 |
| $Li_2CO_3$ | 723 |
| ZnO | 1975 |
| $Na_2CO_3$ | 854 |
| $MoO_3$ | 795 |

Inorganic Particle Mixture—Particle Size

The particle size of the inorganic particle mixture may not be particularly limited in some embodiments of the present invention.

However, the inventors have found that inorganic particle mixtures with certain particle size distributions are surprisingly useful. Control of the particle size distribution is therefore important in some aspects of the invention.

The invention may relate to embodiments in which the inorganic particle mixture has a particle size distribution in which either (a) $D_{10} \leq 0.41$ μm;
(b) $D_{50} \leq 1.6$ μm;
(c) $D_{90} \leq 4.1$ μm;
(d) $(D_{50}-D_{10}) \leq 1.15$ μm;
(e) $(D_{90}-D_{50}) \leq 2.5$ μm;
(f) $(D_{90}-D_{10}) \leq 3.7$ μm; or
(g) $(D_{50}/D_{10}) \leq 3.85$.

One or more, two or more, three or more, four or more, five or more or six or more of these requirements may be met in the present invention.

In some embodiments, requirement (a) is met. In some embodiments requirement (b) is met. In some embodiments, requirement (c) is met. In some embodiments, requirement (d) is met. In some embodiments, requirement (e) is met. In some embodiments, requirement (f) is met. In some embodiments, requirement (g) is met.

Any combination of these requirements may be met in embodiments of the invention.

Regarding requirement (a), $D_{10}$ is 0.41 μm or lower, for example 0.4 μm or lower, 0.39 μm or lower, 0.35 μm or lower, 0.32 μm or lower, 0.3 μm or lower, 0.28 μm or lower, 0.25 μm or lower or 0.24 μm or lower.

The value of $D_{10}$ is preferably 0.4 μm or lower.

Typically, the $D_{10}$ particle size may be at least 0.1 μm, at least 0.12 μm, at least 0.14 μm, at least 0.17 μm or at least 0.2 μm.

Accordingly, in some embodiments $D_{10}$ is within the range 0.2 μm≤$D_{10}$≤0.4 μm.

Regarding requirement (b), the $D_{50}$ of the inorganic particle mixture is preferably less than or equal to 1.6 μm. The $D_{50}$ may be 1.55 μm or lower, 1.5 μm or lower, 1.45 μm or lower, 1.4 μm or lower, 1.35 μm or lower, 1.3 μm or lower, 1.25 μm or lower, 1.2 μm or lower, 1.15 μm or lower, 1.1 μm or lower, 1.05 μm or lower, 1 μm or lower or 0.95 μm or lower.

The value of $D_{50}$ is preferably 1.05 μm or lower.

Typically, the $D_{50}$ particle size may be at least 0.1 μm, at least 0.3 μm, at least 0.5 μm, or at least 0.8 μm.

Accordingly, in some embodiments $D_{50}$ is within the range 0.3 μm≤$D_{50}$≤1.05 μm.

Regarding requirement (c), the $D_{90}$ of the inorganic particle mixture is preferably less than or equal to 4.1 μm. The $D_{90}$ may be 4 μm or lower, 3.8 μm or lower, 3.6 μm or lower, 3.4 μm or lower, 3.2 μm or lower, 3 μm or lower, 2.8 μm or lower, 2.6 μm or lower, 2.4 μm or lower, 2.2 μm or lower, 2.1 μm or lower, 2 μm or lower or 1.9 μm or lower.

The value of $D_{90}$ is preferably 2.2 μm or lower.

Typically, the $D_{90}$ particle size may be at least 1 μm, at least 1.2 μm, at least 1.4 μm, or at least 1.5 μm.

Accordingly, in some embodiments $D_{90}$ is within the range 1.4 μm $D_{90}$ 2.2 μm.

Regarding requirement (d), $(D_{50}-D_{10})$ is 1.15 μm or lower, for example 1.1 μm or lower, 1 μm or lower, 0.8 μm or lower, 0.6 μm or lower, 0.59 μm or lower, 0.58 μm or lower, 0.57 μm or lower, 0.56 μm or lower, 0.55 μm or lower, 0.54 μm or lower or 0.53 μm or lower.

The value of $(D_{50}-D_{10})$ is preferably 0.6 μm or lower.

Typically, the difference between $D_{50}$ and $D_{10}$ may be at least 0.1 μm, at least 0.2 μm, at least 0.3 μm, or at least 0.35 μm.

Accordingly, in some embodiments $(D_{50}-D_{10})$ is within the range 0.3 μm≤$(D_{90}-D_{10})$≤0.6 μm.

Regarding requirement (e), $(D_{90}-D_{50})$ is 2.5 μm or lower, for example 2 μm or lower, 1.75 μm or lower, 1.5 μm or lower, 1.25 μm or lower, 1.15 μm or lower, 1.1 μm or lower, 1.05 μm or lower, 1 μm or lower or 0.95 μm or lower.

The value of $(D_{90}-D_{50})$ is preferably 1.15 μm or lower.

Typically, the difference between $D_{90}$ and $D_{50}$ may be at least 0.5 μm, at least 0.6 μm, at least 0.7 μm, or at least 0.75 μm.

Accordingly, in some embodiments $(D_{90}-D_{50})$ is within the range 0.6 μm≤$(D_{90}-D_{50})$≤1.15 μm.

Regarding requirement (f), $(D_{90}-D_{10})$, that is, the difference between $D_{90}$ and $D_{10}$, is preferably less than or equal to 3.7 μm. The value of $(D_{90}-D_{10})$ may be 3.5 μm or lower, 3 μm or lower, 2.5 μm or lower, 2 μm or lower, 1.8 μm or lower, 1.6 μm or lower, 1.5 μm or lower, 1.45 μm or lower, 1.4 μm or lower, or 1.35 μm or lower.

The value of $(D_{90}-D_{10})$ is preferably 1.8 μm or lower.

Typically, the difference between $D_{90}$ and $D_{10}$ may be at least 1 μm, at least 1.1 μm, at least 1.2 μm, or at least 1.3 μm.

Accordingly, in some embodiments $(D_{90}-D_{10})$ is within the range 1.1 μm≤$(D_{90}-D_{10})$≤1.8 μm.

Regarding requirement (g), $(D_{50}/D_{10})$, that is, the value obtaining by dividing $D_{50}$ by $D_{10}$, is less than or equal to 3.85. The value of $(D_{50}/D_{10})$ may be 3.8 or lower, 3.7 or lower, 3.6 or lower, 3.5 or lower, 3.4 or lower, 3.3 or lower, 3.2 or lower, 3.1 or lower, 3 or lower, 2.8 or lower, or 2.6 or lower.

The value of $(D_{50}/D_{10})$ is preferably 3.6 or lower.

Typically, the ratio between $D_{50}$ and $D_{10}$ may be at least 1, at least 1.5, at least 2, or at least 2.3 μm.

Accordingly, in some embodiments $(D_{50}/D_{10})$ is within the range 2.2≤$(D_{50}/D_{10})$≤3.6.

The particle sizes and distributions described herein may be determined using a laser diffraction method (e.g. using a Malvern Mastersizer 2000).

Inorganic Particle Mixture—Preparation

The inorganic particle mixture may be prepared by mixing raw materials for the desired metal compounds. Those raw materials may be the oxides, carbonates and so on discussed above. The mixing can be performed in a known manner. Typically, no melting, quenching or other glass production technique is carried out on the inorganic particle mixture.

Mixing or blending the above described materials can lead to an inorganic particle mixture suitable for use in the present invention. Those raw materials may be used in substantially crystalline form.

Mixing or blending techniques are well known in this technical field. The present inventors have found that the co-milling technique is particularly effective in preparing a suitable inorganic (e.g. oxide) particle mixture. Without wishing to be bound by theory, this is believed to be due to its effect on reducing particle size and/or providing a narrow particle size distribution. Alternatively, each component of the inorganic particle mixture may be milled separately (or otherwise processed to provide the desired particle size and/or particle size distribution, if necessary) before being combined to provide the inorganic particle mixture.

Mixing (e.g. co-milling) the raw materials for the inorganic particle mixture may be followed by mixing the resultant blend with an organic medium and an electrically conductive material, for example, in any order. Co-milling may be the only processing carried out on the raw materials for the inorganic particle mixture. For example, no method for glass production may be carried out. It will be understood that alternatively, each component of the inorganic particle mixture could be added separately to the electrically conductive material and the organic medium in order to obtain the conductive paste of the present invention.

For example, the above discussed oxides, carbonates, nitrates and so on may be blended. Then resultant mixture may then be milled or not. When milled, the process may be carried out, for example, in a planetary mill to provide the desired particle size distribution as discussed above. Wet milling can be carried out in an organic solvent, such as butyldiglycol. A resultant blended powder may then be dried. Sieving may be carried out, to further adjust the particle size distribution.

Conductive Paste

The conductive paste is suitable for forming a conductive track or coating on a substrate. It is particularly suitable for forming a surface electrode on a semiconductor substrate, e.g. in a solar cell. The conductive paste is also suitable for forming an electrode on a thin film solar cell. The conductive paste may be a front side conductive paste.

The solids portion of the conductive paste of the present invention may include 80 to 99.9 wt % of electrically conductive material. For example, the solids portion may include at least 80 wt %, at least 82 wt %, at least 85 wt %, at least 87 wt % at least 90 wt %, at least 93 wt % or at least 95 wt % of electrically conductive material. The solids portion may include 99.9 wt % or less, 99.5 wt % or less, 99 wt % or less, 95 wt % or less, 92 wt % or less, 90 wt % or less, 88 wt % or less, or 86 wt % or less of electrically conductive material.

Generally, the electrically conductive material may be the main component of the solids portion, that is, the ingredient of the solids portion whose content is the highest.

The electrically conductive material may comprise one or more metals selected from silver, copper, nickel and aluminium. Preferably, the electrically conductive material comprises or consists of silver. This is particularly preferable in solar cell applications, e.g. where the paste is intended for contact with an n-type emitter of a solar cell. In some embodiments, particularly where the paste is intended for contact with a p-type emitter of a solar cell, the conductive material may comprise aluminium, e.g. it may be a blend of silver and aluminium.

The electrically conductive material may be provided in the form of particles, e.g. metal particles. The form of the particles is not particularly limited, but may be in the form of flakes, spherical particles, granules, crystals, powder or other irregular particles, or mixtures thereof.

The particle size of the electrically conductive material is not particularly limited in the present invention. Typically, the $D_{50}$ particle size may be at least 0.1 µm, at least 0.5 µm, or at least 1 µm. The $D_{50}$ particle size may be 15 µm or less, 10 µm or less, 5 µm or less, 4 µm or less, 3 µm or less or 2 µm or less. The particle size may be determined using a laser diffraction method (e.g. using a Malvern Mastersizer 2000).

The surface area of the electrically conductive material is not particularly limited in the present invention. For example, it may be at least 0.1 m$^2$/g, at least 0.2 m$^2$/g, at least 0.3 m$^2$/g, at least 0.4 m$^2$/g or at least 0.5 m$^2$/g. For example, it may be 5 m$^2$/g or less, 3 m$^2$/g or less, 2 m$^2$/g or less, 1 m$^2$/g or less, 0.8 m$^2$/g or less or 0.7 m$^2$/g or less.

Where the conductive material is, or includes, silver, suitably a silver powder may be used. A suitable silver powder is Metalor® 554-2.

The solids portion of the conductive paste of the present invention may include 0.1 to 15 wt % of inorganic (e.g. oxide) particle mixture. For example, the solids portion may include at least 0.2 wt %, at least 0.5 wt % or at least wt % of inorganic (e.g. oxide) particle mixture. The solids portion may include 10 wt % or less, 7 wt % or less or 5 wt % or less of inorganic (e.g. oxide) particle mixture.

Generally, in some embodiments, an inorganic particle mixture comprising or consisting of substantially crystalline particles of one or more metal oxides is the ingredient, amongst the ingredients of the solids portion, with the second to highest content.

The solids portion may include one or more additional additive materials, e.g. 0 to 10 wt % or 0 to 5 wt % of additional additive material.

Organic Medium

The solids portion of the conductive paste of the present invention is dispersed in organic medium. The organic medium may constitute, for example, at least 2 wt %, at least 5 wt % or at least 9 wt % of the conductive paste. The organic medium may constitute 20 wt % or less, 15 wt % or less, 13 wt % or less or 10 wt % or less of the conductive paste.

Accordingly, it will be understood that the solids portion may constitute at least 80 wt %, at least 85 wt %, at least 87 wt % or at least 90 wt % of the conductive paste. The solids portion may constitute 98 wt % or less, 95 wt % or less or 91 wt % or less of the conductive paste.

The organic medium typically comprises an organic solvent with one or more additives dissolved or dispersed therein. As the skilled person will readily understand, the components of the organic medium are typically chosen to provide suitable consistency and rheology properties to permit the conductive paste to be printed onto a semiconductor substrate, and to render the paste stable during transport and storage.

Examples of suitable solvents for the organic medium include one or more solvents selected from the group consisting of butyl diglycol, butyldiglycol acetate, terpineol, diakylene glycol alkyl ethers (such as diethylene glycol dibutyl ether and tripropyleneglycol monomethylether), ester alcohol (such as Texanol®), 2-(2-methoxypropoxy)-1-propanol and mixtures thereof.

Examples of suitable additives include those dispersants to assist dispersion of the solids portion in the paste, viscosity/rheology modifiers, thixotropy modifiers, wetting agents, thickeners, stabilisers and surfactants.

For example, the organic medium may comprise one or more selected from the group consisting of rosin (kollophonium resin), acrylic resin (e.g. Neocryl®), alkylammonium salt of a polycarboxylic acid polymer (e.g. Dysperbik® 110 or 111), polyamide wax (such as Thixatrol Plus® or Thixatrol Max®), nitrocellulose, ethylcellulose, hydroxypropyl cellulose and lecithin.

Typically, the conductive paste is prepared by mixing together electrically conductive material, the components of the inorganic particle mixture and the components of the organic medium, in any order.

Manufacture of a Surface Electrode and Solar Cell

The skilled person is familiar with suitable methods for the manufacture of a surface electrode of a solar cell. Similarly, the skilled person is familiar with suitable methods for the manufacture of a solar cell.

The method for the manufacture of a surface electrode of a solar cell typically comprises applying a conductive paste onto the surface of a semiconductor substrate, and firing the applied conductive paste.

The conductive paste may be applied to the substrate by any suitable method. For example, the conductive paste may be applied by printing, such as by screen printing or inkjet printing. The conductive paste may be applied on a semiconductor substrate to form a light receiving surface electrode of a solar cell. Alternatively, the conductive paste may be applied on a semiconductor substrate to form a back side surface electrode of a solar cell. The solar cell may be an n-type or a p-type solar cell. The paste may be applied onto an n-type emitter (in a p-type solar cell), or onto a p-type emitter (in an n-type solar cell). Some solar cells are known as back junction cells. In this case, it may be preferred that the conductive paste of the present invention is applied to the back side surface of the semiconductor substrate of the solar cell. Such a back side surface is typically covered with an insulating passivation layer (e.g. SiN layer), similar to the anti-reflective coating applied to the light receiving surface of a solar cell. Alternatively, the conductive paste may be applied to a thin film solar cell or the conductive paste may be applied to a substrate for an electronic device other than a solar cell.

The skilled person is aware of suitable techniques for firing the applied conductive paste on the substrate. An example firing curve is shown in FIG. 1. A typical firing process lasts approximately 30 seconds (s), with the surface of electrode reaching a peak temperature of about 800° C. Typically the furnace temperature will be higher to achieve this surface temperature. The firing may for example last for 1 hour or less, 30 minutes or less, 10 minutes or less or 5 minutes or less. The firing may last at least 10 seconds. For example, the peak surface temperature of the electrode may be 1200° C. or less, 1100° C. or less, 1000° C. or less, 950° C. or less, 900° C. or less, 800° C. or less, 850° C. or less, or 750° C. or less. The peak surface temperature of the electrode may be at least 500° C. or at least 600° C.

Typically, the surface temperature exceeds 500° C. for a period of 2 minutes or less, e.g. for a period of 90 s or less, for a period of 60 s or less, for a period of 50 s or less, for a period of 40 s or less, for a period of 30 s or less, for a period of 20 s or less, for a period of 15 s or less, or for a period of 10 s or less. Typically, the surface temperature exceeds 600° C. for a period of 2 minutes or less, e.g. for a period of 90 s or less, for a period of 60 s or less, for a period of 50 s or less, for a period of 40 s or less, for a period of 30 s or less, for a period of 20 s or less, for a period of 15 s or less, for a period of 10 s or less, or for a period of 5 s or less. Typically, the surface temperature exceeds 700° C. for a period of 2 minutes or less, e.g. for a period of 90 s or less, for a period of 60 s or less, for a period of 50 s or less, for a period of 40 s or less, for a period of 30 s or less, for a period of 20 s or less, for a period of 15 s or less, for a period of 10 s or less, for a period of 7 s or less, for a period of 5 s or less, for a period of 4 s or less, or for a period of 3 s or less.

The semiconductor substrate of the electrode may be a silicon substrate. For example, it may be a single crystal semiconductor substrate, or a multi crystal semiconductor substrate. Alternative substrates include CdTe. The semiconductor may for example be a p-type semiconductor or an n-type semiconductor.

The semiconductor substrate may comprise an insulating layer on a surface thereof. Typically the conductive paste of the present invention is applied on top of the insulating layer to form the electrode. Typically, the insulating layer will be non-reflective. A suitable insulating layer is SiNx (e.g. SiN). Other suitable insulating layers include $Si_3N_4$, $SiO_2$, $Al_2O_3$ and $TiO_2$.

Methods for the manufacture of a p-type solar cell may comprise applying a back side conductive paste (e.g. comprising aluminium) to a surface of the semiconductor substrate, and firing the back side conductive paste to form a back side electrode. The back side conductive paste is typically applied to the opposite face of the semiconductor substrate from the light receiving surface electrode.

In the manufacture of p-type solar cells, typically, the back side conductive paste is applied to the back side (non-light receiving side) of the semiconductor substrate and dried on the substrate, after which the front side conductive paste is applied to the front side (light-receiving side) of the semiconductor substrate and dried on the substrate. Alternatively, the front side paste may be applied first, followed by application of the back side paste. The conductive pastes are typically co-fired (i.e. the substrate having both front- and back-side pastes applied thereto is fired, to form a solar cell comprising front- and back-side conductive tracks.

The efficiency of the solar cell may be improved by providing a passivation layer on the back side of the substrate. Suitable materials include SiNx (e.g. SiN), $Si_3N_4$, $SiO_2$, $Al_2O_3$ and $TiO_2$. Typically, regions of the passivation layer are locally removed (e.g. by laser ablation) to permit contact between the semiconductor substrate and the back side conductive track. Alternatively, where pastes of the present invention are applied to the back side, the paste may act to etch the passivation layer to enable electrical contact to form between the semiconductor substrate and the conductive track.

Where a conductive track is formed on a substrate other than a semiconductor substrate for a solar cell, the way in which the conductive paste is applied to the substrate is not particularly limited. For example, the conductive paste may be printed onto the substrate (e.g. inkjet printed or screen printed), or it may be coated onto the substrate (e.g. dip coated). The firing conditions are also not particularly limited but may be similar to those described above with reference to forming a surface electrode for a solar cell.

The fired conductive track or coating comprises a conductive layer formed from the particles of electrically conductive material. Typically, this is a bulk metal or alloy layer. The fired conductive track or coating comprises an amorphous oxide layer formed from the inorganic particle mixture. This may comprise a glass or may comprise glassy phases. The glass or glassy phase may comprise one or more components of the inorganic particle mixture as a network forming component. The amorphous layer may include some crystalline domains.

Where ranges are specified herein it is intended that each endpoint of the range is independent. Accordingly, it is expressly contemplated that each recited upper endpoint of a range is independently combinable with each recited lower endpoint, and vice versa.

EXAMPLES

Glass Frit and Inorganic Blend

Glass frits and inorganic blends were prepared using commercially available raw materials. The compositions of the glass frit and inorganic blends are given in Tables 1 2 and 3 below.

TABLE 1

Glass frit compositions (Compositions in weight % and mol % on an oxide basis)

| Composition | | $TeO_2$ | $Li_2O$ | $Bi_2O_3$ | ZnO | $CeO_2$ | $Na_2O$ | $MoO_3$ |
|---|---|---|---|---|---|---|---|---|
| Comparative A | mol % | 52.5 | 15.6 | 14.6 | 6.9 | 6.2 | 3.0 | 1.3 |
| | wt % | 45.0 | 2.5 | 36.5 | 3.0 | 11.0 | 1.0 | 1.0 |

TABLE 2

Inorganic blend compositions (Compositions in weight % on an oxide basis)

| Composition | | $TeO_2$ | $Li_2CO_3$ | $Bi_2O_3$ | $Bi_5O(OH)_9(NO_3)_4$ | ZnO | $CeO_2$ | $Na_2CO_3$ | $MoO_3$ |
|---|---|---|---|---|---|---|---|---|---|
| A | wt % | 39.4 | 5.5 | 0 | 40.1 | 2.6 | 10.1 | 1.5 | 0.9 |
| B | wt % | 42.8 | 5.9 | 34.8 | 0 | 2.9 | 11.0 | 1.6 | 1.0 |
| C | wt % | 87.9 | 12.1 | 0 | 0 | 0 | 0 | 0 | 0 |
| D | wt % | 51.3 | 7.1 | 41.7 | 0 | 0 | 0 | 0 | 0 |
| E | wt % | 49.5 | 6.8 | 40.3 | 0 | 3.4 | 0 | 0 | 0 |
| F | wt % | 49.0 | 6.8 | 39.8 | 0 | 3.3 | 0 | 0 | 1.1 |

TABLE 3

Inorganic blend compositions (Compositions in weight % on an oxide basis)

| | | $TeO_2$ | $Li_2CO_3$ | $Bi_2O_3$ | $Bi_5O(OH)_9(NO_3)_4$ | ZnO | $CeO_2$ | $Na_2CO_3$ | $MoO_2$ | $H_2WO_4$ | $BaCO_3$ |
|---|---|---|---|---|---|---|---|---|---|---|---|
| G | wt % | 48.2 | 6.1 | 24.2 | 8.3 | 0 | 5.9 | 3.4 | 0 | 0 | 0 |
| H | wt % | 51.6 | 6.6 | 18.7 | 9.0 | 0 | 6.3 | 3.6 | 0 | 0 | 0 |
| I | wt % | 49.3 | 6.3 | 17.9 | 8.5 | 0 | 6.0 | 3.4 | 4.5 | 0 | 0 |
| J | wt % | 47.4 | 6.0 | 17.2 | 8.2 | 0 | 5.8 | 3.3 | 0 | 8.3 | 3.8 |
| K | wt % | 54.5 | 7.9 | 27.3 | 0 | 2.0 | 3.9 | 3.2 | 0 | 0 | 1.1 |
| L | wt % | 52.3 | 6.7 | 26.2 | 0 | 1.9 | 3.8 | 3.6 | 0 | 4.5 | 1.1 |

The glass was made according to the following standard procedure. Raw materials for the glass were mixed using a laboratory mixer. One hundred grams of the mixture was melted in ceramic crucible, in a Carbolite electrical laboratory furnace. The crucibles containing the raw material mixture were placed in the furnace while it was still cold, to avoid thermal shock and cracking of the ceramic crucible. The melting was carried out at 1000-1200° C. in air. The molten glass was quenched in water to obtain the glass frit. The frit was dried overnight in a heating chamber at 120° C., then wet milled in a planetary mill to provide particles having a $D_{90}$ particle size less than 2 µm (determined using a laser diffraction method using a Malvern Mastersizer 2000). Wet milling may be carried out in organic solvent or water. The glass powder was dried in tray dryer and sieved.

Inorganic blends A to L were prepared by mixing the oxides, carbonates and nitrates using a laboratory mixer to produce a mixed material, followed by wet milling of the mixed material in butyldiglycol to produce a co-milled material. The milling conditions are set out in Table 4 below. The resultant blended powders were then dried in a tray drier and sieved.

Further inorganic blends A1 and A2 were prepared, using the same recipe and raw materials of composition A, by individually milling the separate components and subsequently combining them to form the inorganic blend. A1 was prepared by wet-milling the individual oxides, carbonates and nitrates separately, followed by drying each milled component individually in a tray dryer. The resulting dry powders were then combined and homogenised using a laboratory mixer to produce inorganic blend A1. Inorganic blend A2 was prepared by wet-milling the individual oxides, carbonates and nitrates separately, followed by mixing the slurries resulting from wet-milling the individual components. The resulting mixed slurry was homogenised using a laboratory mixer then dried in a tray drier to form inorganic blend A2.

X-Ray Diffraction Analysis

Figure 2:
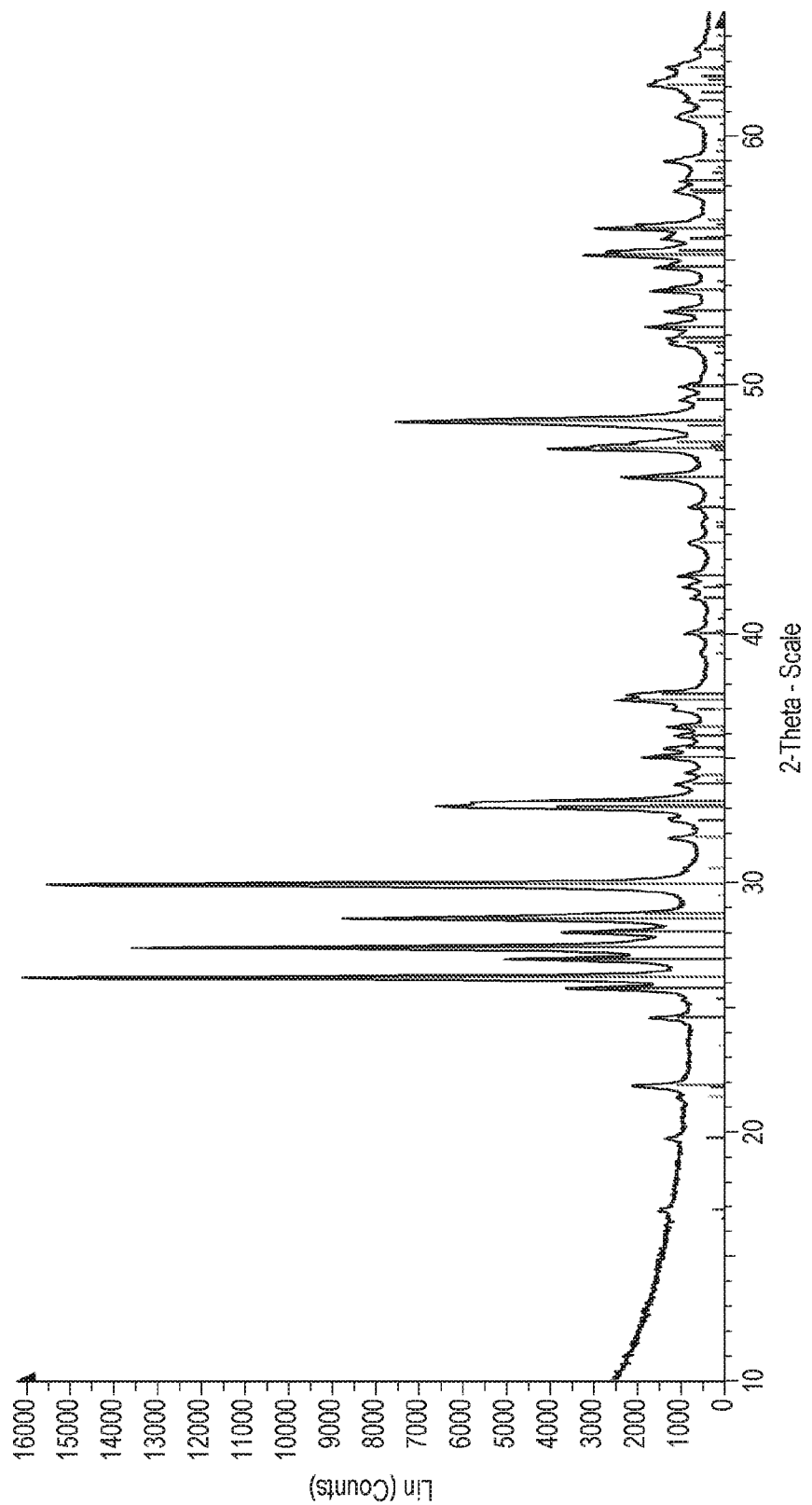
FIG. 2 shows an XRD analysis of an inorganic particle mixture.
Figure 3:
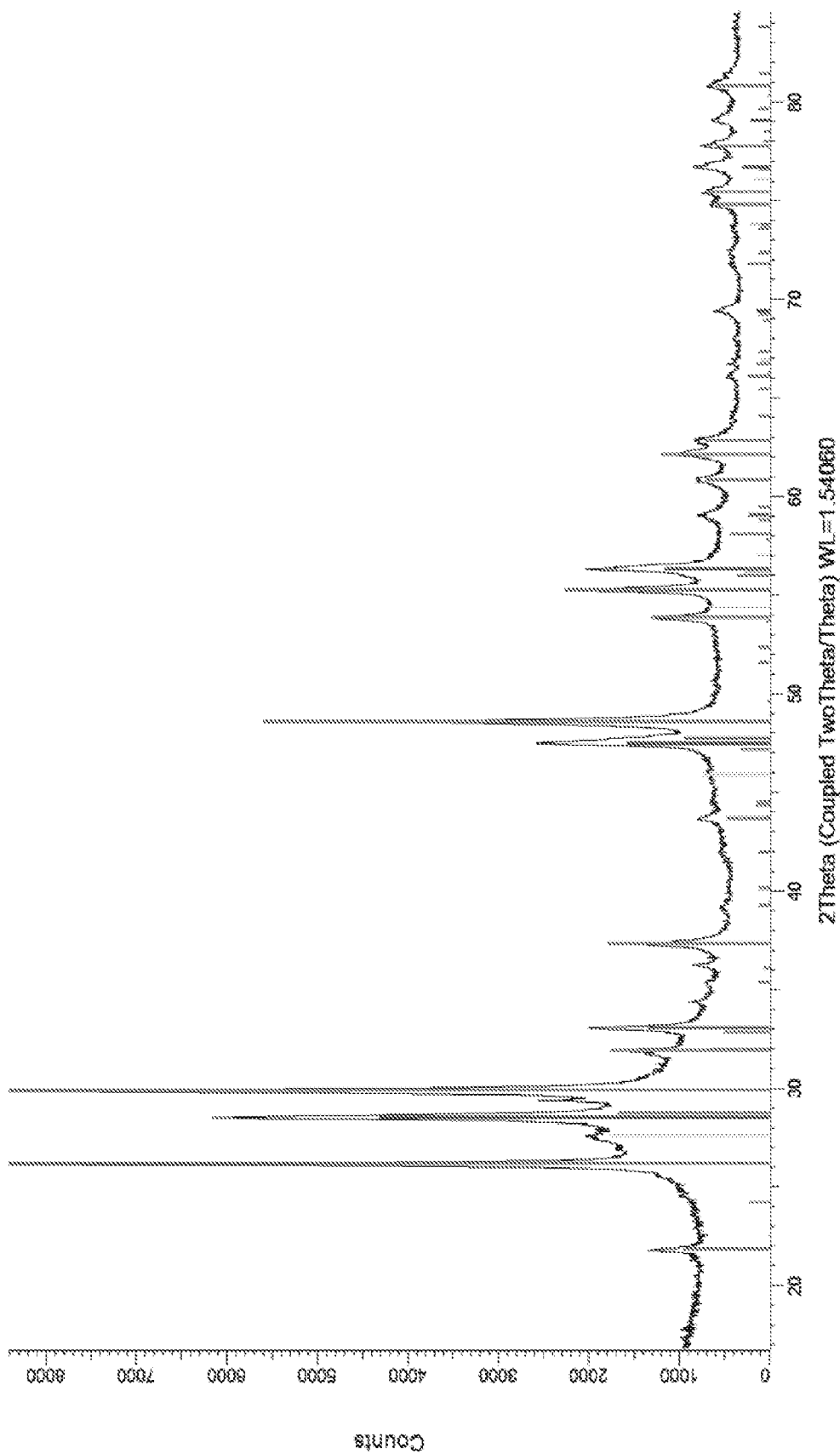
FIG. 3 shows an XRD analysis of a co-milled inorganic particle mixture.

Samples of composition B were submitted for X-Ray Diffraction (XRD) analysis as a mixed material (i.e. prior to the milling step described above) and as co-milled material (after the milling step). XRD analysis is a tool used for identifying the atomic and molecular structure of a crystal by measuring the angles and intensities of these diffracted beams. The analysis of the mixed material and the co-milled material of composition B are shown in FIGS. 2 and 3, respectively.

The results indicate that the mixed material presents a large number of peaks corresponding to the crystalline raw materials (FIG. 2), including oxides of tellurium, cerium, bismuth and zinc, and lithium carbonate. The milled material diffraction pattern contains fewer peaks and a halo pattern 25 and 35°. The halo pattern indicates a possible amorphization ('X-ray amorphous' material) of the material (or part of the material). Peaks corresponding to crystalline oxides of tellurium, bismuth and cerium are identifiable.

Figure 4:
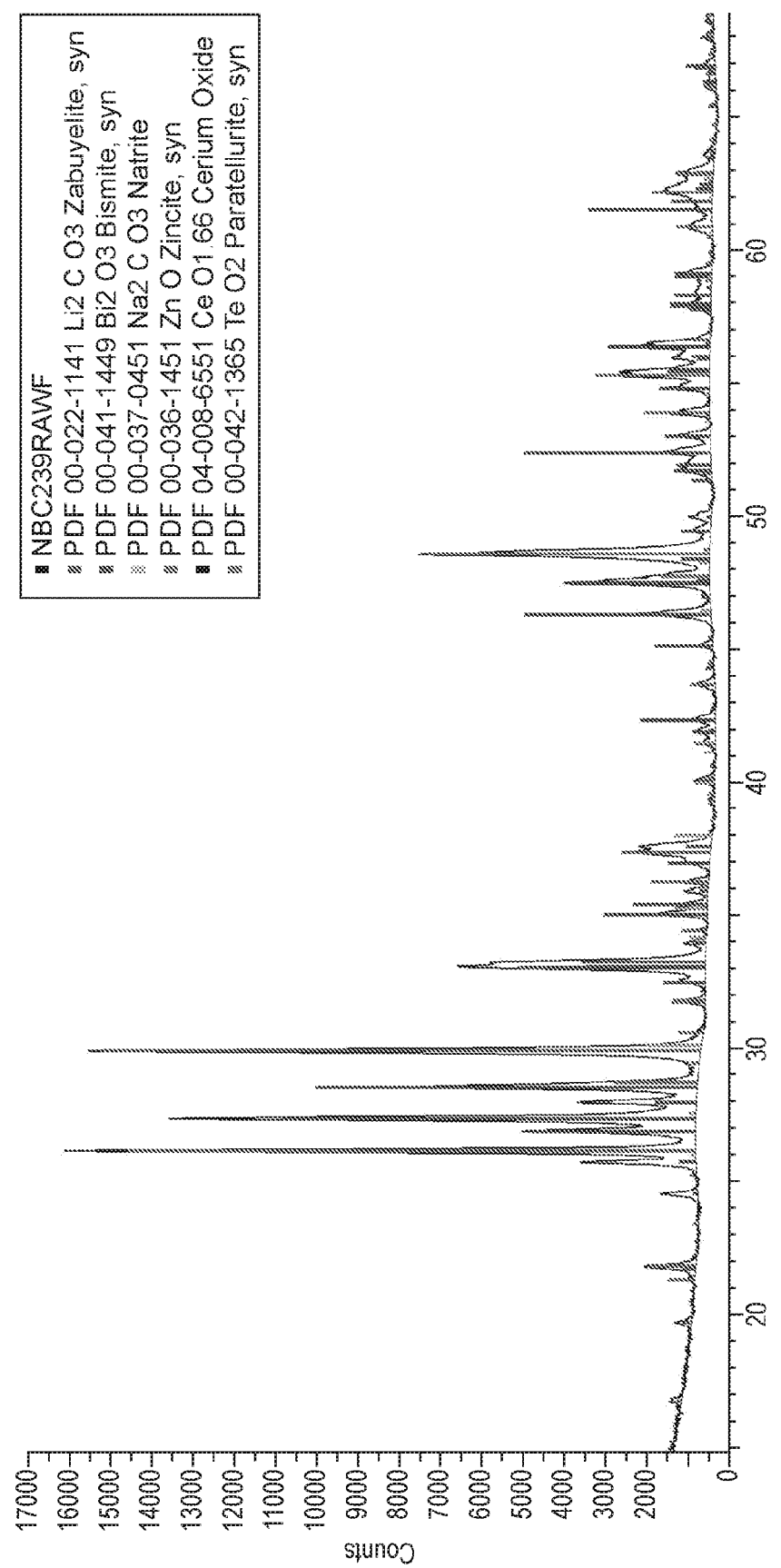
FIG. 4 shows an XRD analysis of an inorganic particle mixture formed by separately milling the individual components and then mixing the milled components.

Samples of inorganic blend A2 were submitted for X-Ray Diffraction (XRD) analysis. The analysis of inorganic blend A2 is shown in FIG. 4.

The results indicate that inorganic blend A2 presents a large number of peaks corresponding to the crystalline raw materials (FIG. 4), including oxides of tellurium, cerium, bismuth and zinc, and lithium carbonate.

Hot Stage Microscope Analysis

The Hot Stage Microscopy (HSM) is an effective technique to determine fusibility, sintering point, softening point, melting point and wetting behaviour of the melting phase on a substrate. This method was used to compare the glass composition and the inorganic blends. Crystalline silicon solar cells pieces were used as substrate in order to observe wettability of the material on a solar cell containing anti-reflective coating layer (ARC), as well as to observe possible reactions between glass/inorganic blend and ARC layer. The flow behaviour shown by HSM indicates how the material will flow in the paste, showing the tendency of what will happens in the real solar cells firing process.

Figure 5:
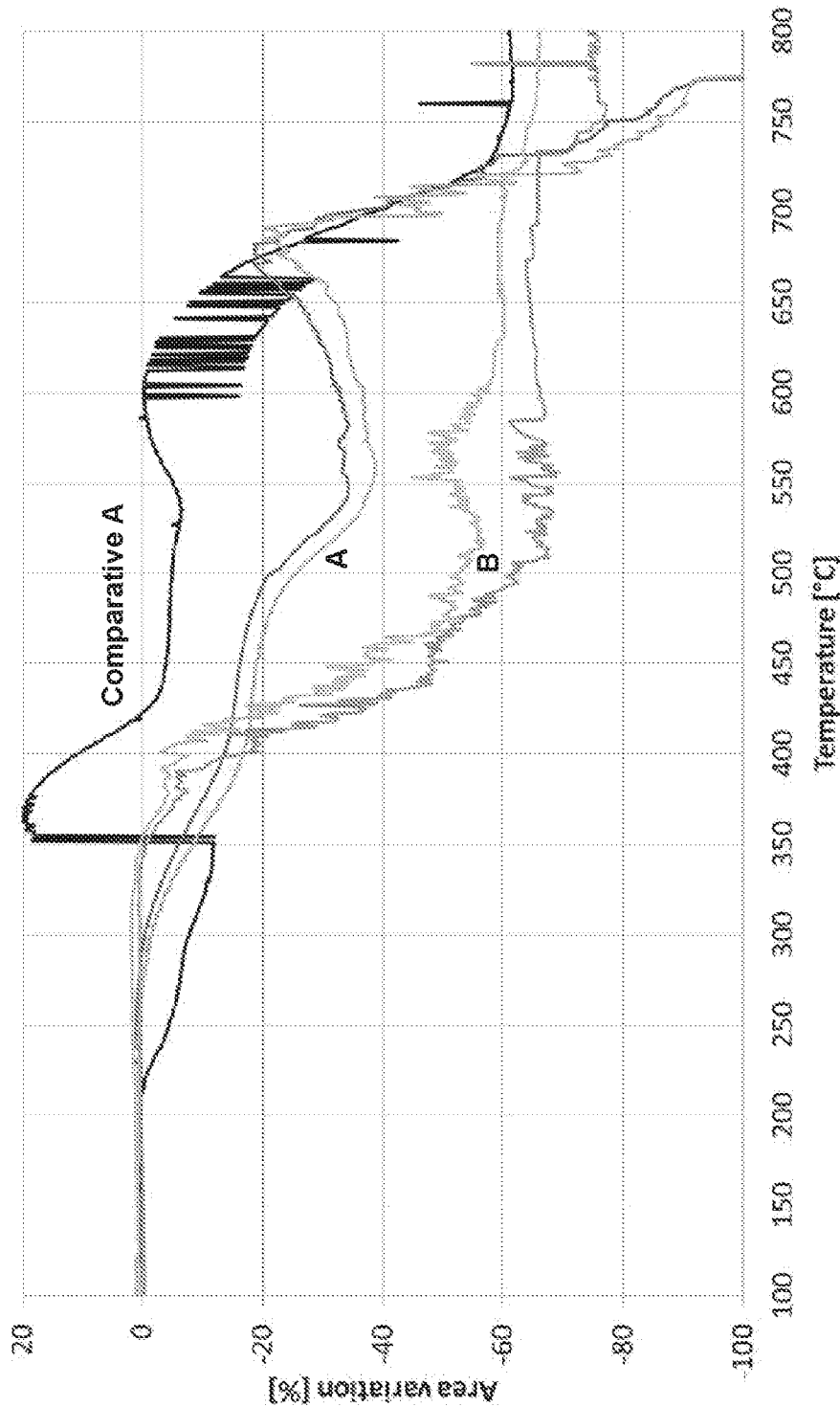
FIG. 5 shows sintering curve comparisons for various inorganic particle mixtures and a glass.

The comparison between Comparative Composition A and the inorganic blend variations with bismuth oxide and bismuth sub-nitrate (Compositions A and B) are shown in FIG. 5. The glass presents an expansion at about 350° C. which could be due to redox reactions happening in the glass matrix, and the softening point occurs at about 600° C. when the flow starts.

The inorganic blend containing bismuth sub-nitrate (Composition A) starts sintering (decomposition of bismuth subnitrate) at about 260° C., and flow starts about 100° C. above the follow temperature of the glass (Comparative Composition A), at about 700° C. Composition B has a much lower flow temperature, of about 400° C.

Figure 6:
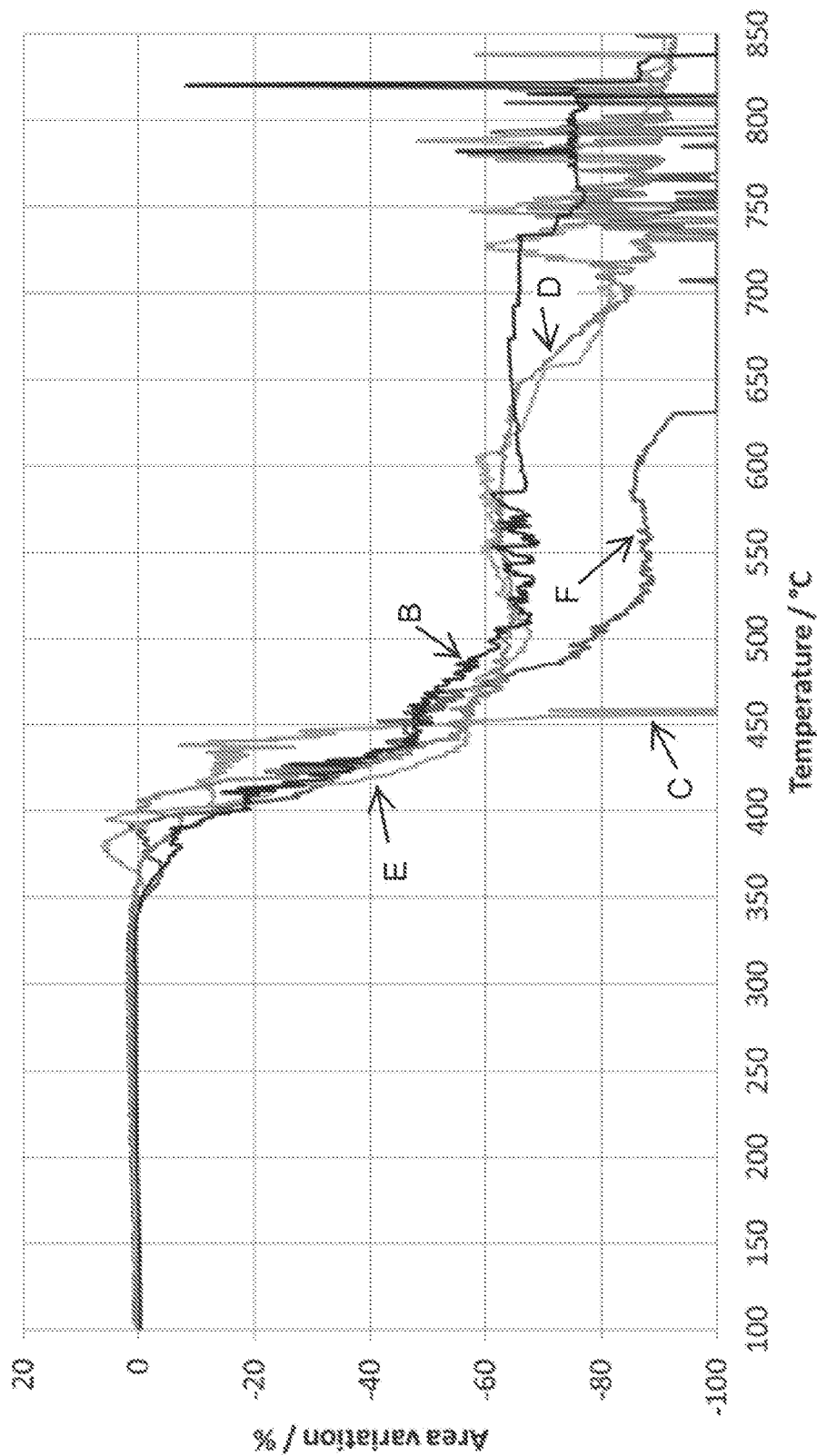
FIG. 6 shows sintering curve comparisons for various other inorganic particle mixtures.

Further HSM experiments were made by simplifying the original inorganic blend composition, shown on FIG. 6. The compositions described in Table 2 as Compositions C, D, E and F were tested. From the results found, it seems to be that the combinations Te—Li, Te—Li—Bi, Te—Li—Zn—Bi and Te—Li—Zn to a lesser extent are helpful for the good flow behavior which is interesting for solar cell metallization.

Paste Preparation

Conductive silver pastes comprising substantially crystalline inorganic particle mixtures were prepared using 88 wt % of a commercial silver powder, 2 wt % or 1.5 wt % of inorganic blend, the balance being standard organic medium. The inorganic blend compositions were milled under different conditions to provide different particle size distributions. The particle size distributions (PSD) of the inorganic blends and the milling conditions are described in Table 4. Wet milling was carried out in butyldiglycol. After milling, the inorganic particle mixture was dried in a tray drier and sieved. The particle size was determined using a laser diffraction method (e.g. using a Malvern Mastersizer 2000). A comparative conductive silver paste was also prepared using 88 wt % of a commercial silver powder, 2 wt % glass frit, the balance being standard organic medium. The pastes were prepared by pre-mixing all the components and passing several times in a triple roll mill, producing a homogeneous paste. Viscosities were adjusted by adding medium or solvent to have similar values at shear rate of 100 $s^{-1}$. The paste compositions used in the solar cell formation described below are presented in Table 5.

TABLE 4

Glass and inorganic blend particle size distribution (measured using a Malvern Mastersizer 2000)

| Example | Composition | Milling | PSD/μm $D_{10}$ | $D_{50}$ | $D_{90}$ |
|---|---|---|---|---|---|
| Comparative | Comparative A | n/a | 0.34 | 0.77 | 1.60 |
| 1 | B | Planetary mill | 0.22 | 0.57 | 1.52 |
| 2 | B | Laboratory bead mill, 90 mins | 0.23 | 0.81 | 1.57 |
| 3 | B | Laboratory bead mill, 60 mins | 0.41 | 1.06 | 2.22 |
| 4 | B | Laboratory bead mill, 30 mins | 0.42 | 1.62 | 4.15 |
| 5 | B | Laboratory bead mill, 15 mins | 0.45 | 2.13 | 5.08 |
| 6 | B | Laboratory bead mill, 5 mins | 0.58 | 2.90 | 7.33 |
| 7 | B | Not milled | 0.90 | 4.45 | 25.70 |
| 8 | A | Planetary mill | 0.39 | 0.92 | 1.84 |
| 9 | A | Not milled | 1.24 | 3.85 | 9.93 |
| 10 | G | Planetary mill | 0.33 | 0.72 | 1.66 |
| 11 | H | Planetary mill | 0.26 | 0.56 | 1.25 |
| 12 | I | Planetary mill | 0.34 | 0.70 | 1.40 |
| 13 | J | Planetary mill | 0.33 | 0.66 | 1.29 |
| 14 | K | Planetary mill | 0.28 | 0.66 | 1.36 |
| 15 | L | Planetary mill | 0.27 | 0.61 | 1.25 |
| 16 | A | Planetary mill | 0.3-1 | 0.5-3 | 1.8-5 |
| 17 | A1 | Components milled separately | 0.3-1 | 0.5-3 | 1.8-5 |
| 18 | A2 | Components milled separately | 0.3-1 | 0.5-3 | 1.8-5 |

TABLE 5

Conductive paste compositions (Compositions in weight %)

| Paste | Silver (wt. %) | Glass | (wt. %) | Inorganic blend | (wt. %) | Organic Medium (wt. %) |
|---|---|---|---|---|---|---|
| 1329TD | 88 | Comparative | 2 | — | 0 | 10 |
| 1340TD | 88 | Glass-free | 0 | Example 8 | 2 | 10 |
| 1379BC | 88 | Glass-free | 0 | Example 9 | 2 | 10 |
| 1382BC | 88 | Glass-free | 0 | Example 7 | 2 | 10 |
| 1383BC | 88 | Glass-free | 0 | Example 1 | 2 | 10 |
| 1442BC | 88 | Glass-free | 0 | Example 2 | 2 | 10 |
| 1443BC | 88 | Glass-free | 0 | Example 6 | 2 | 10 |
| 1445BC | 88 | Glass-free | 0 | Example 4 | 2 | 10 |
| 1446BC | 88 | Glass-free | 0 | Example 3 | 2 | 10 |
| 2045BC | 88.5 | Glass-free | 0 | Example 10 | 1.5 | 10 |
| 2046BC | 88.5 | Glass-free | 0 | Example 11 | 1.5 | 10 |
| 2047BC | 88.5 | Glass-free | 0 | Example 12 | 1.5 | 10 |

TABLE 5-continued

Conductive paste compositions (Compositions in weight %)

| Paste | Silver (wt. %) | Glass | (wt. %) | Inorganic blend | (wt. %) | Organic Medium (wt. %) |
|---|---|---|---|---|---|---|
| 2048BC | 88.5 | Glass-free | 0 | Example 13 | 1.5 | 10 |
| 2049BC | 88.5 | Glass-free | 0 | Example 14 | 1.5 | 10 |
| 2050BC | 88.5 | Glass-free | 0 | Example 15 | 1.5 | 10 |
| 1538BC | 88 | Glass-free | 0 | Example 16 | 2 | 10 |
| 1536BC | 88 | Glass-free | 0 | Example 17 | 2 | 10 |
| 1537BC | 88 | Glass-free | 0 | Example 18 | 2 | 10 |

Solar Cell Formation

Multicrystalline wafers with sheet resistance of 90 Ohm/sq, 6 inches size, were screen printed on their back side with commercially available aluminum paste, dried in an IR Mass belt dryer and randomized in groups. Each of these groups was screen printed with a front side silver paste which was one of the conductive pastes described herein and set out in more detail above.

The screens used for the front side pastes had finger opening 50 μm. After printing the front side the cells were dried in the IR Mass belt dryer and fired in a Despatch belt furnace. The Despatch furnace had six firing zones with upper and lower heaters. The first three zones are programmed around 500° C. for burning of the binder from the paste, the fourth and fifth zone are at a higher temperature, with a maximum temperature of 945° C. in the final zone (furnace temperature). The furnace belt speed for this experiment was 610 cm/min. The recorded temperature was determined by measuring the temperature at the surface of the solar cell during the firing process using a thermocouple. The temperature at the surface of the solar cell did not exceed 800° C. This is typical of the firing temperature employed for pastes comprising a glass which typically has a softening point of about 600° C. It is surprising that such good flow behaviour and contact formation are observed for the crystalline inorganic particle mixture of the present invention.

After cooling the fired solar cells were tested in an I-V curve tracer from Halm, model cetisPV-CTL1. The results are provided by the I-V curve tracer, either by direct measurement or calculation using its internal software.

(To minimize the influence of the contact area the cells were prepared using the same screen for printing, and the same viscosity paste in each individual test set. This ensures that the line widths of the compared pastes were substantially identical and had no influence on the measuring.)

Solar Cell Performance

Fill factor indicates the performance of the solar cell relative to a theoretical ideal (0 resistance) system. The fill factor correlates with the contact resistance—the lower the contact resistance the higher the fill factor will be. But if the inorganic additive of the conductive paste is too aggressive it could damage the pn junction of the semiconductor. In this case the contact resistance would be low but due to the damage of the pn junction (recombination effects and lower shunt resistance) a lower fill factor would occur. A high fill factor therefore indicates that there is a low contact resistance between silicon wafer and the conductive track, and that firing of the paste on the semiconductor has not negatively affected the pn junction of the semiconductor (i.e. the shunt resistance is high).

The quality of the pn junction can be determined by measuring the pseudo fill factor (SunsVocFF). This is the fill factor independent of losses due to resistance in the cell. Accordingly, the lower the contact resistance and the higher the SunsVoc FF, the higher the resulting fill factor will be. The skilled person is familiar with methods for determining SunsVoc FF, for example as described in Reference 1. SunsVoc FF is measured under open circuit conditions, and is independent of series resistance effects.

Eta represents the efficiency of the solar cell, comparing solar energy in to electrical energy out. Small changes in efficiency can be very valuable in commercial solar cells.

TABLE 6

Solar Cell Test PV 185 Results

| Paste | Glass/Inorganic blend | Eta max (%) | Uoc (V) | FF (%) | SunsVoc FF (%) | Eta (%) | Series Resistance (Ohm · cm$^2$) |
|---|---|---|---|---|---|---|---|
| 1329TD | Comparative | 17.76 | 0.6283 | 77.70 | 80.676 | 17.25 | 0.0026 |
| 1340TD | Example 8 | 17.53 | 0.6263 | 78.69 | 81.649 | 17.36 | 0.0023 |
| 1379BC | Example 9 | 16.91 | 0.625 | 75.51 | 78.38 | 16.70 | 0.0026 |
| 1382BC | Example 7 | 16.30 | 0.614 | 71.64 | 73.31 | 15.55 | 0.0016 |
| 1383BC | Example 1 | 17.57 | 0.6269 | 79.09 | 81.621 | 17.42 | 0.0022 |
| 1442BC | Example 2 | 17.42 | 0.626 | 77.20 | 79.83 | 16.93 | 0.0023 |
| 1443BC | Example 6 | 15.90 | 0.617 | 71.69 | 73.27 | 15.50 | 0.0014 |
| 1445BC | Example 4 | 16.26 | 0.620 | 72.32 | 73.95 | 15.71 | 0.0015 |
| 1446BC | Example 3 | 16.93 | 0.623 | 75.98 | 78.37 | 16.59 | 0.0020 |

TABLE 7

Solar Cell Test PV 241 Results

| Paste | Glass/Inorganic blend | Eta max (%) | Uoc (V) | FF (%) | SunsVoc FF (%) | Eta (%) | Series Resistance (Ohm · cm$^2$) |
|---|---|---|---|---|---|---|---|
| 1329TD | Comparative | 17.84 | 0.633 | 78.69 | 82.02 | 17.71 | 0.0026 |
| 2045BC | Example 10 | 18.05 | 0.633 | 78.70 | 82.11 | 17.82 | 0.0026 |
| 2046BC | Example 11 | 18.03 | 0.632 | 78.74 | 82.11 | 17.81 | 0.0026 |
| 2047BC | Example 12 | 17.90 | 0.634 | 78.29 | 82.06 | 17.82 | 0.0030 |
| 2048BC | Example 13 | 18.00 | 0.634 | 78.40 | 82.12 | 17.77 | 0.0028 |
| 2049BC | Example 14 | 17.97 | 0.631 | 78.67 | 81.94 | 17.83 | 0.0025 |
| 2050BC | Example 15 | 17.97 | 0.633 | 78.61 | 82.10 | 17.86 | 0.0027 |

TABLE 8

Solar Cell Test PV Results

| Paste | Glass/Inorganic blend | Eta max (%) | Uoc (V) | FF (%) | SunsVoc FF (%) | Eta (%) | Series Resistance (Ohm · cm$^2$) |
|---|---|---|---|---|---|---|---|
| 1538BC | Example 16 | 17.38 | 0.628 | 77.73 | 80.96 | 17.25 | 0.0025 |
| 1536BC | Example 17 | 17.56 | 0.628 | 77.71 | 80.74 | 17.35 | 0.0025 |
| 1537BC | Example 18 | 17.75 | 0.627 | 78.16 | 81.31 | 17.55 | 0.0025 |

Comparing the results from Table 6 and the corresponding PSD data in Table 4 it is possible to conclude that particle size distribution and homogeneity of the inorganic blend has an impact on the final cell performance.

For example Paste 1382BC made with the paste of Example 7 shows a big variation between the median efficiency (eta) and the maximum efficiency (eta max) than the materials with smaller particles and better homogenization.

Comparing the results shown in Table 8, it is possible to conclude that the manner in which the inorganic oxide mixture is prepared may have an impact on final cell performance.

Specific Contact Resistance

Further tests were performed using the TLM method for measuring specific contact resistance (Table 10).

Conductive silver pastes were prepared using 87.5 wt % silver powder, 2.5 wt. % inorganic blend powder, for the compositions see Table 8, and organic medium.

For these tests the inorganic blend composition was Turbula mixed for 30 mins before 10 g of the mixed powder was speedy-mixed twice with 10 g of ZrO$_2$ 2 mm balls, at 3000 rpm, 30 s.

The printed contacts on the Si$_3$N$_4$ coated silicon wafers were then fired using a Rapid Thermal Processing furnace. The firing process is very short, temperatures ranging from 600-650° C. in the region of 30-60 seconds, during which the contact between the printed silver paste and the p-n junction with the silicon wafer is created.

The inorganic blend compositions used are presented on Table 9.

TABLE 9

Inorganic blend compositions (Compositions in weight % on an oxide basis)

| Composition | | TeO$_2$ | Li$_2$CO$_3$ | Bi$_2$O$_3$ | ZnO | Na$_2$CO$_3$ | MoO$_3$ |
|---|---|---|---|---|---|---|---|
| M | wt % | 48.2 | 6.7 | 39.1 | 3.2 | 1.8 | 1.0 |
| N | wt % | 48.7 | 6.7 | 39.6 | 3.2 | 1.8 | 0 |
| O | wt % | 49.7 | 6.9 | 40.4 | 0 | 1.9 | 1.1 |
| P | wt % | 50.3 | 7.0 | 40.8 | 0 | 1.9 | 0 |

TABLE 10

Specific contact resistance measurements of silver contacts on a Si$_3$N$_4$/Si wafer. The silver paste contained silver and 2.5 wt % composition M-P as the inorganic blend.

| Firing Temperature (° C.) | Composition M (Ω · mm$^2$) | Composition N (Ω · mm$^2$) | Composition O (Ω · mm$^2$) | Composition P (Ω · mm$^2$) |
|---|---|---|---|---|
| 610 | 5.1 | 9.2 | 27.2 | 27.1 |
| 620 | 2.1 | 4.6 | 12.7 | 14.0 |
| 630 | 2.2 | 9.0 | 28.3 | 8.0 |
| 640 | 1.9 | 2.8 | 11.2 | 6.0 |

Compositions M and N provide excellent specific contact resistance of the silver contacts. There also appears to be a general trend of increased firing temperature improving the specific contact resistance. From the specific contact resistance values it can be seen that the presence of ZnO, (composition M and N) within an inorganic blend containing Li$_2$CO$_3$, Na$_2$CO$_3$, Bi$_2$O$_3$ and TeO$_2$ with or without the presence of MoO$_3$ appears to improve the conductivity of the contact.

Analysis of Fired Conductive Track

Figure 7:
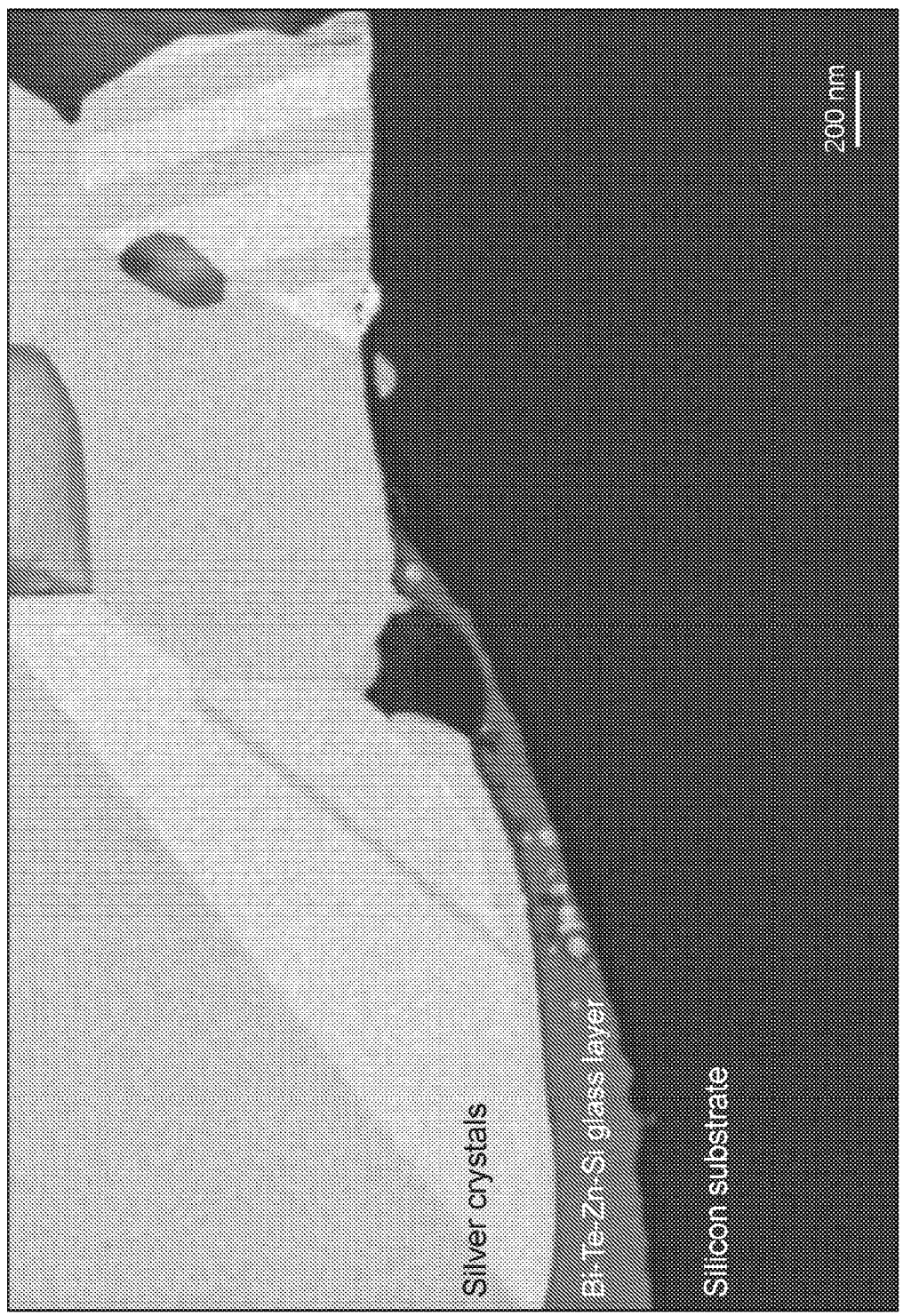
FIG. 7 shows an SEM image of a conductive track for a solar cell fired on a silicon substrate according to an embodiment of the present invention.
Figure 8:
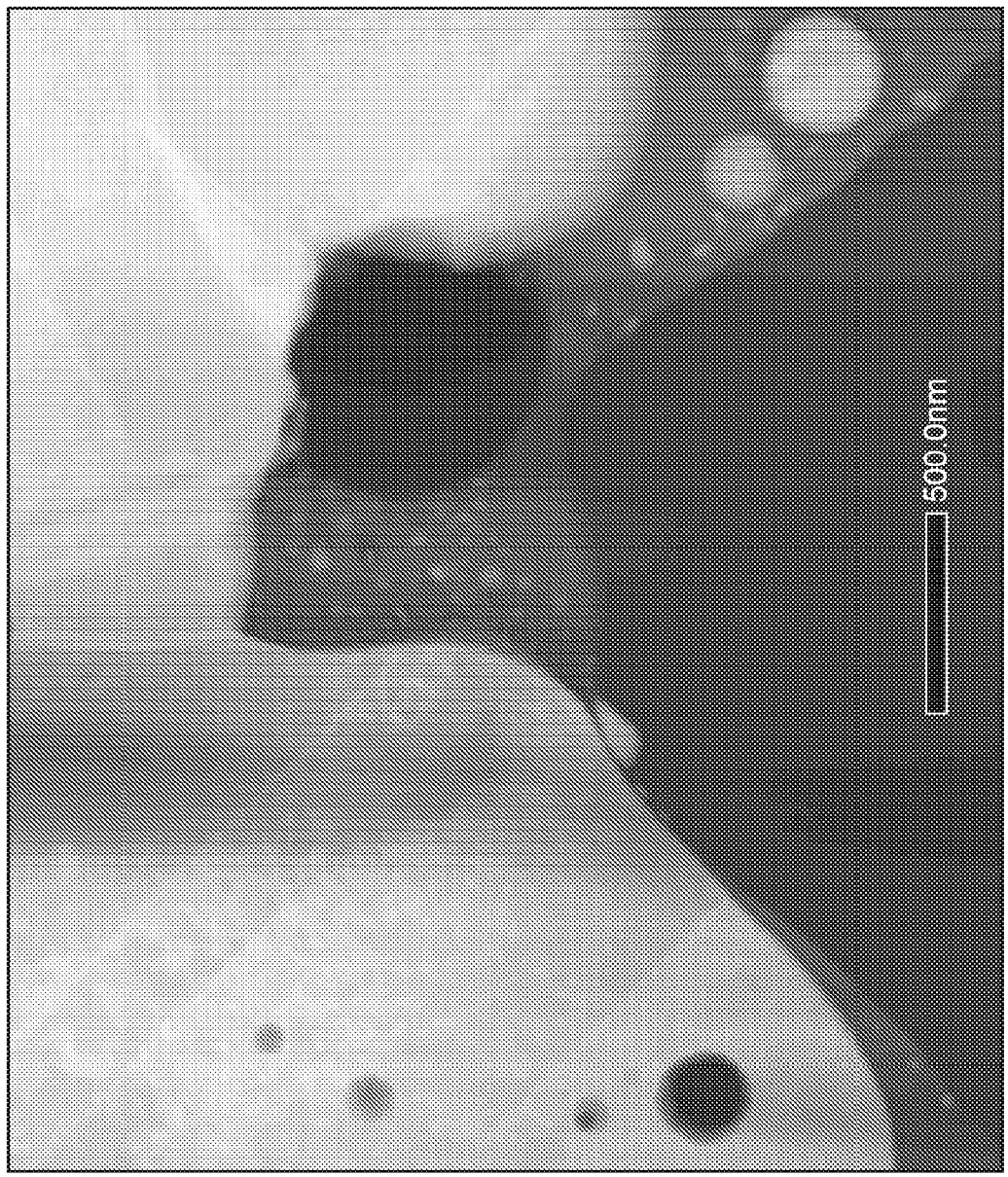
FIG. 8 shows an TEM image of a conductive track for a solar cell fired on a silicon substrate according to an embodiment of the present invention.

The pastes TD1340 (containing the inorganic blend of Example 8) and 2050BC (containing the inorganic blend of Example 15) were prepared as described above. This pastes were screen printed on multi crystalline wafers and fired according to the firing profile described. FIG. 7 is an SEM image of a cross-section of the fired conductive track formed from paste TD1340, in which the interface between the conductive track and the silicon substrate is shown. FIG. 8 is an TEM image of a cross-section of the fired conductive track formed from paste 2050BC, in which the interface between the conductive track and the silicon substrate is shown. In both cases, EDX analysis (in scanning mode for TEM) showed that the glassy phase formed in the interface between silver and silicon substrate is a glass. This thin glass layer is formed mainly of a Bi—Te—Zn—Si—O glass system. In this glass layer was found silica, which is believed to originate from the silicon nitride layer. Note that any lithium present would not have been detected by the EDX technique, as it is not capable of detecting this element.

REFERENCES

1. A. McEvoy, T. Markvart, L. Castaner. Solar cells: Materials, Manufacture and Operation. Academic Press, second edition, 2013.

The invention claimed is:

1. A process for forming a conductive track or coating on a substrate, comprising:
   (i) applying an amount of a conductive paste to the substrate, the conductive paste consisting of a glass-free solids portion dispersed in an organic medium, the solids portion comprising particles of electrically conductive material and an inorganic particle mixture comprising substantially crystalline particles of two or more different metal compounds, wherein the inorganic particle mixture is substantially lead free and wherein the inorganic particle mixture comprises substantially crystalline $TeO_2$ particles that include only Te as a metal; and
   (ii) firing the applied amount of conductive paste on the surface of the substrate with a firing profile in which the temperature of the surface of the applied conductive paste exceeds 500° C. for a period of two minutes or less, to produce the conductive track from the applied conductive paste, the conductive track comprising a conductive layer formed from the particles of electrically conductive material and an amorphous oxide layer formed from the inorganic particle mixture.

2. The process according to claim 1 wherein the substrate is a semiconductor substrate of a solar cell.

3. The process according to claim 1, wherein at least 10 wt %, of the components of the inorganic particle mixture have a melting point in excess of 800° C.

4. The process according to claim 1, wherein the surface temperature of the conductive paste exceeds 500° C. for a period of 20 seconds or less.

5. The process according to claim 1, wherein the surface temperature of the conductive paste exceeds 600° C. for a period of 15 seconds or less.

6. The process according to claim 1, herein the surface temperature of the conductive paste exceeds 700° C. for a period of 5 seconds or less.

7. The process according to claim 1, wherein the surface temperature of the conductive paste does not exceed 800° C.

8. The process according to claim 1, wherein the conductive layer is a bulk metal or alloy layer.

9. The process according to claim 1, comprising co-milling the substantially crystalline particles of the inorganic particle mixture before they are mixed with the organic medium and the electrically conductive metal.

10. The process according to claim 1, wherein the inorganic particle mixture includes 35 to 65 wt % of the compound of tellurium (calculated as $TeO_2$).

11. A process according to claim 10, wherein the inorganic particle mixture includes 20 to 50 wt % of a compound of bismuth.

12. A process according to claim 11 wherein the compound of bismuth is a bismuth nitrate or $Bi_2O_3$.

13. The process according to claim 1, wherein the inorganic particle mixture includes 20 to 50 wt % of a compound of bismuth (calculated as $Bi_2O_3$).

14. A process according to claim 13 wherein the compound of bismuth is a bismuth nitrate or $Bi_2O_3$.

15. The process according to claim 1, wherein the conductive paste is prepared by mixing an organic medium, an electrically conductive material, and the components of an inorganic particle mixture, in any order.

16. The method according to claim 15, comprising milling each component of the inorganic particle mixture separately prior to mixing the organic medium, the electrically conductive material, and the components of the inorganic particle mixture.

* * * * *